US012721155B2

(12) United States Patent
Kim et al.

(10) Patent No.: US 12,721,155 B2
(45) Date of Patent: Aug. 25, 2026

(54) SEMICONDUCTOR DEVICE

(71) Applicant: SAMSUNG ELECTRONICS CO., LTD., Suwon-si (KR)

(72) Inventors: Jihyung Kim, Seoul (KR); Jaehee Oh, Seongnam-si (KR); Jegwan Hwang, Suwon-si (KR); Shaofeng Ding, Suwon-si (KR); Won Ji Park, Suwon-si (KR); Jeong Hoon Ahn, Seongnam-si (KR); Yun Ki Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 878 days.

(21) Appl. No.: 17/975,002

(22) Filed: Oct. 27, 2022

(65) Prior Publication Data

US 2023/0260893 A1 Aug. 17, 2023

(30) Foreign Application Priority Data

Feb. 15, 2022 (KR) ........................ 10-2022-0019503

(51) Int. Cl.
*H10W 20/40* (2026.01)
*H10D 30/01* (2025.01)
(Continued)

(52) U.S. Cl.
CPC ........ *H10W 20/496* (2026.01); *H10D 30/024* (2025.01); *H10D 30/6211* (2025.01);
(Continued)

(58) Field of Classification Search
CPC ............. H01L 23/5223; H01L 23/5226; H01L 23/5283; H01L 23/5286; H01L 23/481;
(Continued)

(56) References Cited

U.S. PATENT DOCUMENTS 6,495,454 B2 12/2002 Livengood et al.
8,907,451 B2 12/2014 Kim
(Continued)

FOREIGN PATENT DOCUMENTS

KR 10-2009-0127647 A 12/2009
KR 10-2012-0012443 A 2/2012
(Continued)

*Primary Examiner* — Britt Hanley
*Assistant Examiner* — William C. Trice, III
(74) *Attorney, Agent, or Firm* — Sughrue Mion, PLLC

(57) ABSTRACT

A semiconductor device includes a semiconductor substrate having a first surface and a second surface opposite to the first surface; a transistor provided on the first surface of the semiconductor substrate; a power rail provided on the first surface of the semiconductor substrate and electrically connected to the transistor; first and second lower interconnection lines provided on the second surface of the semiconductor substrate and spaced apart from each other in a first direction perpendicular to the second surface of the semiconductor substrate; a penetration via penetrating the semiconductor substrate and connecting a corresponding one of the first and second lower interconnection lines to the power rail; and a capacitor provided between and electrically connected to the first and second lower interconnection lines.

20 Claims, 23 Drawing Sheets

(51) Int. Cl.

| | |
|---|---|
| ***H10D 30/62*** | (2025.01) |
| ***H10D 84/01*** | (2026.01) |
| ***H10D 84/03*** | (2025.01) |
| ***H10D 84/83*** | (2025.01) |
| ***H10W 20/41*** | (2026.01) |
| ***H10W 20/42*** | (2026.01) |

(52) U.S. Cl.

CPC ..... *H10D 84/0149* (2025.01); *H10D 84/0158* (2025.01); *H10D 84/038* (2025.01); *H10D 84/834* (2025.01); *H10W 20/42* (2026.01); *H10W 20/427* (2026.01); *H10W 20/435* (2026.01)

(58) Field of Classification Search

CPC .......................... H01L 23/642; H10D 30/024; H10D 30/6211; H10D 84/0149; H10D 84/0158; H10D 84/038; H10D 84/834; H10D 84/811

See application file for complete search history.

(56) References Cited

U.S. PATENT DOCUMENTS

| | | | | |
|---|---|---|---|---|
| 9,331,062 | B1 | 5/2016 | Lane et al. | |
| 9,443,872 | B2 * | 9/2016 | Miyairi | H10D 30/6743 |
| 10,636,739 | B2 | 4/2020 | Beyne et al. | |
| 11,133,254 | B2 | 9/2021 | Lai et al. | |
| 2012/0032302 | A1 * | 2/2012 | Smith | H01L 23/5223 257/532 |
| 2020/0373331 | A1 | 11/2020 | Kim et al. | |
| 2020/0411636 | A1 | 12/2020 | Kao et al. | |
| 2021/0375861 | A1 * | 12/2021 | Chung | H10D 84/038 |
| 2023/0197599 | A1 * | 6/2023 | Waidhas | H01L 23/5286 257/369 |

FOREIGN PATENT DOCUMENTS

| | | | |
|---|---|---|---|
| KR | 10-2014-0069166 | A | 6/2014 |
| KR | 10-2022-0017023 | A | 2/2022 |

* cited by examiner

FIG. 2A

Figure 2B:
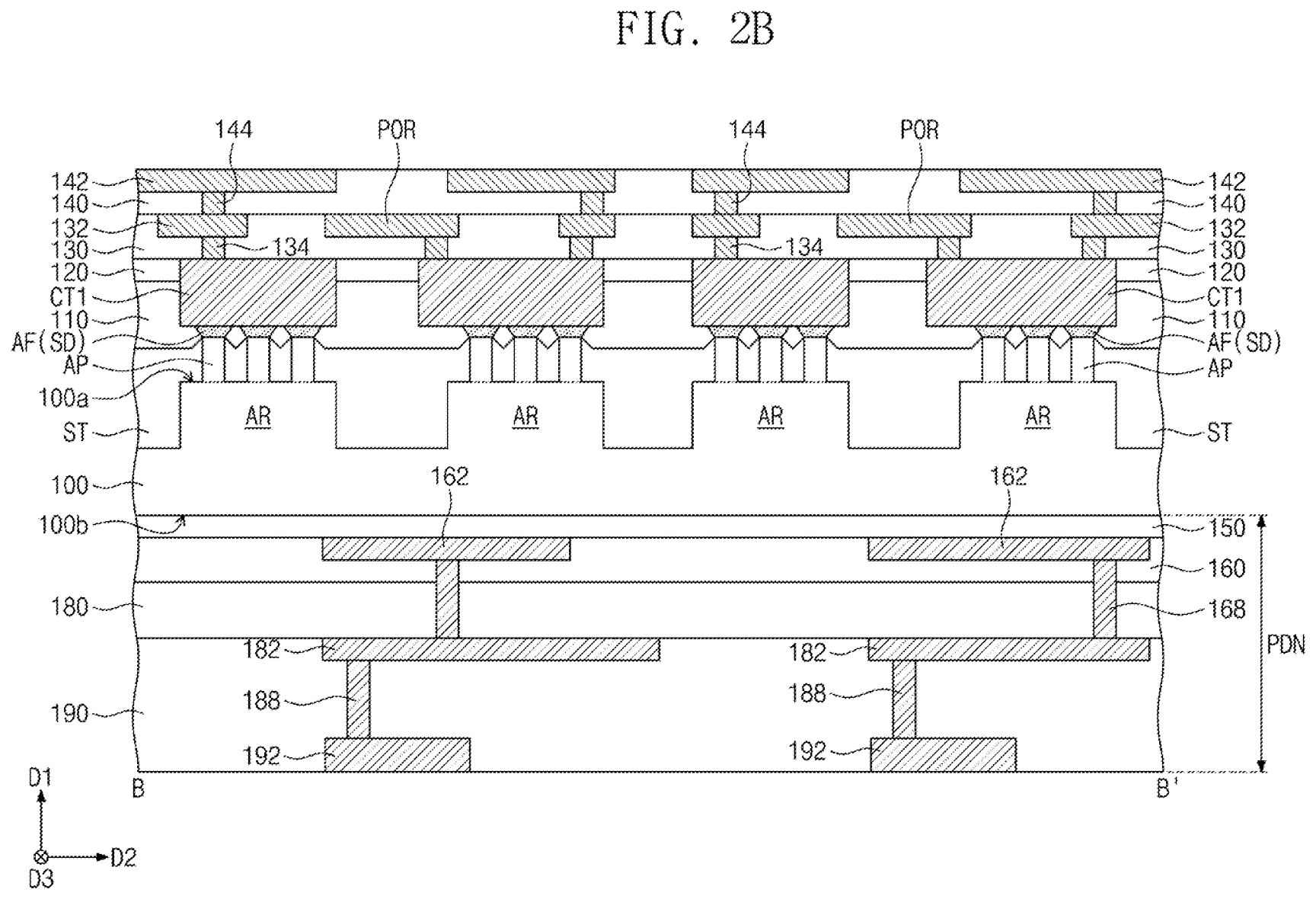

FIG. 2B 142 140 132 130 120 CT1 110 AF(SD) AP ST 150 160 168 PDN B'
POR 144 134 AR 162 182 188 192
142 140 132 130 120 CT1 110 AF(SD) AP 100a ST 100 100b 180 190 B
D1 D2 D3

FIG. 2C

FIG. 3A 142
140
132
130
120
CT1
110
AF(SD)
AP
ST
B'
POR
144
134
AR
T1
T2
100a
100
100b
B
D1
D2
D3

FIG. 4B 142 140 132 130 120 CT1 110 AF(SD) AP ST 150 160 B'
POR 144 134 AR 162
142 140 132 130 120 CT1 110 AF(SD) AP 100a ST 100 100b B
D1 D2 D3

FIG. 4C 142 140 132 130 120 AF(CH) AP 100a ST 100 100b 142 132 GC GE GI GS ST 150 160 C'

144 POR 142 144 132 134 CT2 AR 162 C D1 D2 D3

PDN
142
140
132
130
120
CT1
110
AF(SD)
AP
ST
150
160
164
170H
172
174
176
170
166
162
200
152
POR
144
134
AR
182
188
192
100a
100
100b
185
180
190
A
A'
D1
D2
D3

SEMICONDUCTOR DEVICE

CROSS-REFERENCE TO RELATED APPLICATION

This application is based on and claims priority under 35 U.S.C. § 119 to Korean Patent Application No. 10-2022-0019503, filed on Feb. 15, 2022, in the Korean Intellectual Property Office, the disclosure of which is incorporated by reference herein in its entirety.

BACKGROUND

The present disclosure relates to a semiconductor device, and in particular, to a semiconductor device including field effect transistors.

A semiconductor device includes an integrated circuit composed of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are conducted to overcome technical limitations associated with the scale-down of the semiconductor device and provide a high performance semiconductor device.

SUMMARY

One or more embodiments provide a semiconductor device with high integration density and improved electric characteristics.

According to an aspect of an embodiment, a semiconductor device includes: a semiconductor substrate having a first surface and a second surface opposite to the first surface; a transistor provided on the first surface of the semiconductor substrate; a power rail provided on the first surface of the semiconductor substrate and electrically connected to the transistor; first and second lower interconnection lines provided on the second surface of the semiconductor substrate and spaced apart from each other in a first direction perpendicular to the second surface of the semiconductor substrate; a penetration via penetrating the semiconductor substrate and connecting a corresponding one of the first and second lower interconnection lines to the power rail; and a capacitor provided between and electrically connected to the first and second lower interconnection lines.

According to an aspect of an embodiment, a semiconductor device includes: a semiconductor substrate having a first surface and a second surface opposite to the first surface; active patterns provided on the first surface of the semiconductor substrate; gate electrodes provided on the first surface of the semiconductor substrate and crossing the active patterns; a power rail provided on the first surface of the semiconductor substrate and electrically connected to a source/drain region of a corresponding active pattern of the active patterns; lower interconnection lines provided on the second surface of the semiconductor substrate; a penetration via penetrating the semiconductor substrate and connecting a corresponding one of the lower interconnection lines to the power rail; and a capacitor provided between and electrically connected to a pair of the lower interconnection lines, wherein the lower interconnection lines are spaced apart from each other in a first direction perpendicular to the second surface of the semiconductor substrate and extend in a second direction parallel to the second surface of the semiconductor substrate.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 2A, 2B, 2C, and 2D are sectional views, which are respectively taken along lines A-A', B-B', C-C', and D-D' of FIG. 1;

FIGS. 3A to 3D and 4A to 4D are sectional views illustrating a method of fabricating a semiconductor device according to an embodiment;

FIG. 5 is a sectional view, which is taken along the line A-A' of FIG. 1 to illustrate a semiconductor device according to an embodiment;

FIGS. 9 and 10 are sectional views, which are taken along the line A-A' of FIG. 1 to illustrate a method of fabricating a semiconductor device according to an embodiment;

FIG. 11 is a sectional view, which is taken along the line A-A' of FIG. 1 to illustrate a semiconductor device according to an embodiment;

DETAILED DESCRIPTION

Example embodiments of the disclosure will now be described more fully with reference to the accompanying drawings.

Figure 1:
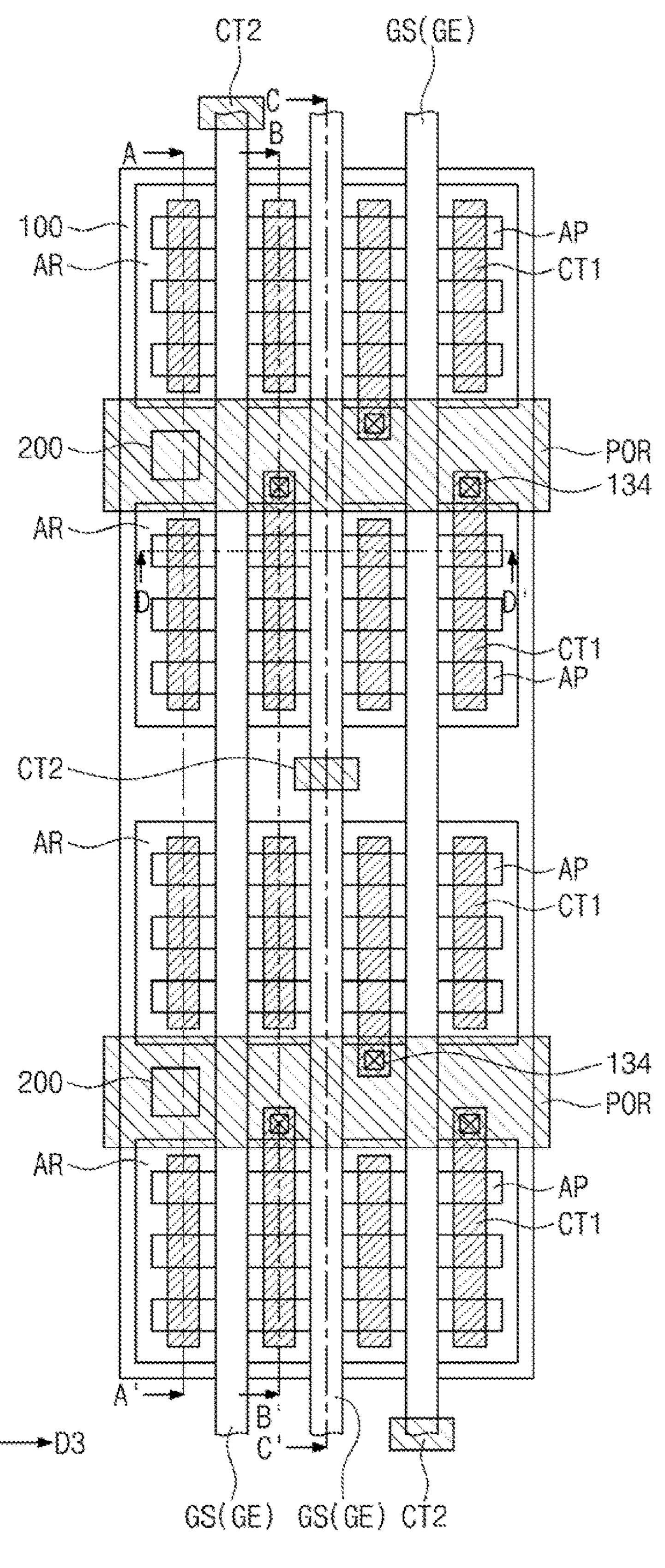
FIG. 1 is a plan view illustrating a semiconductor device according to an embodiment.
Figure 2A:
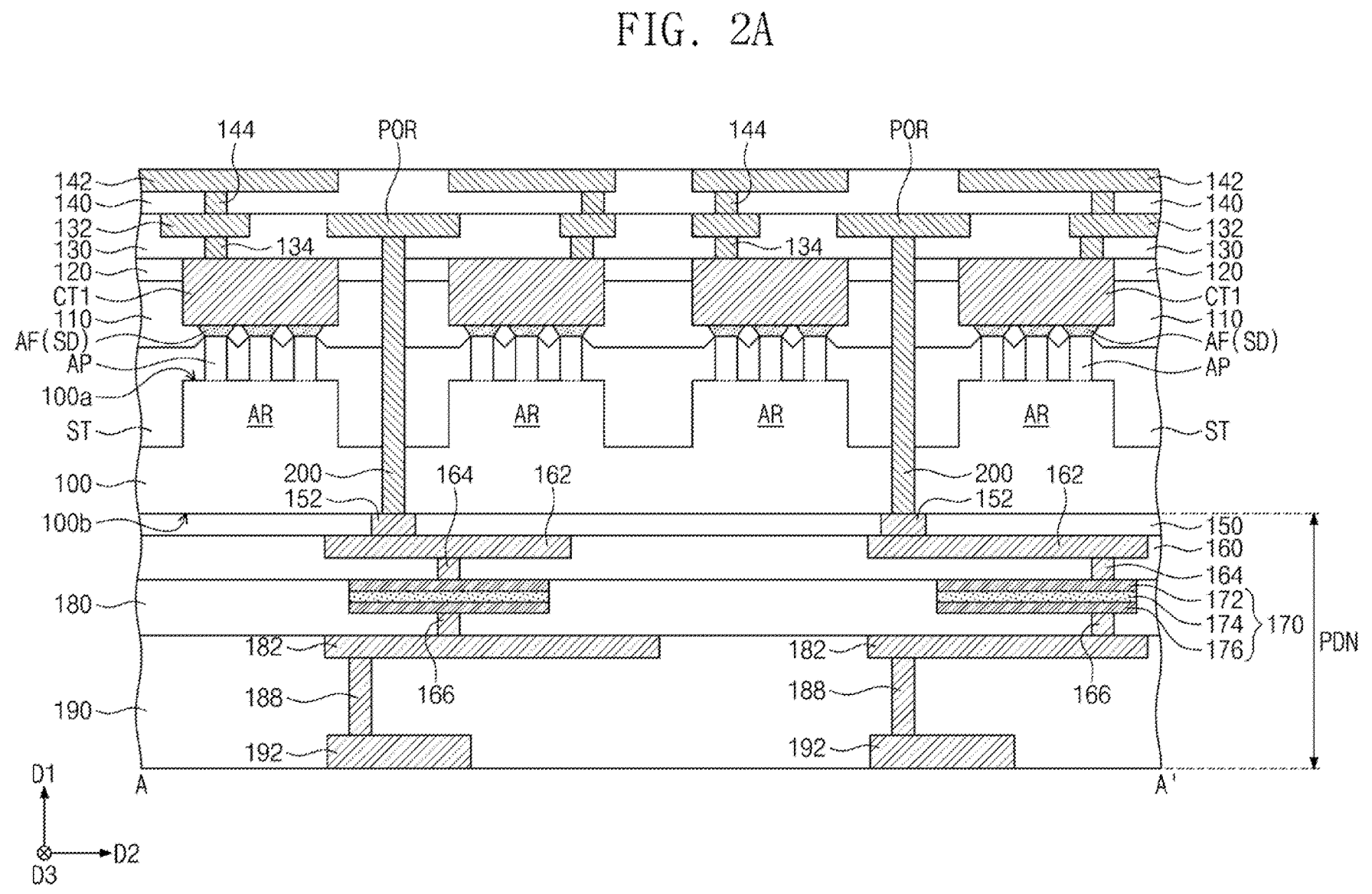
Figure 2C:
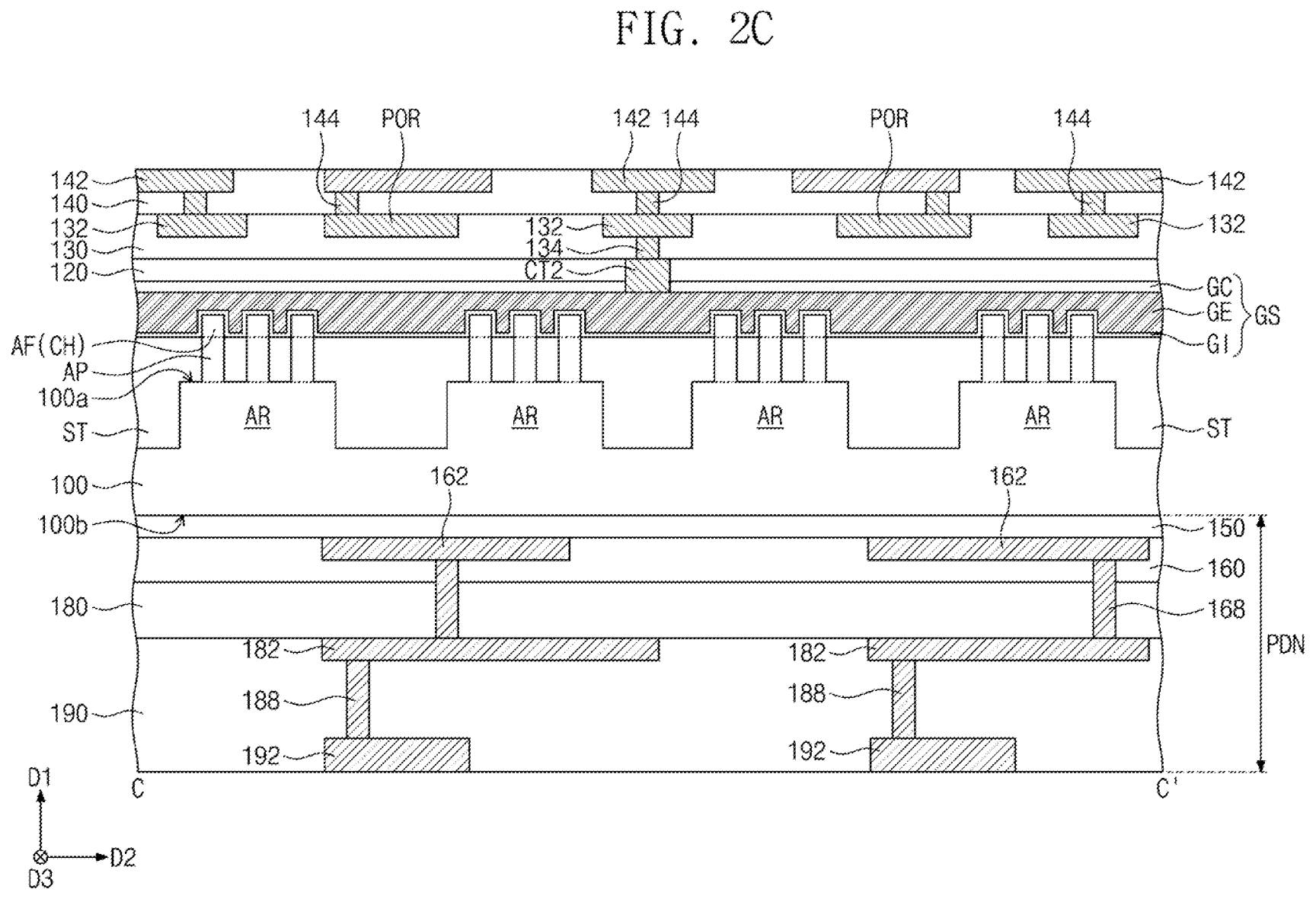
Figure 2D:
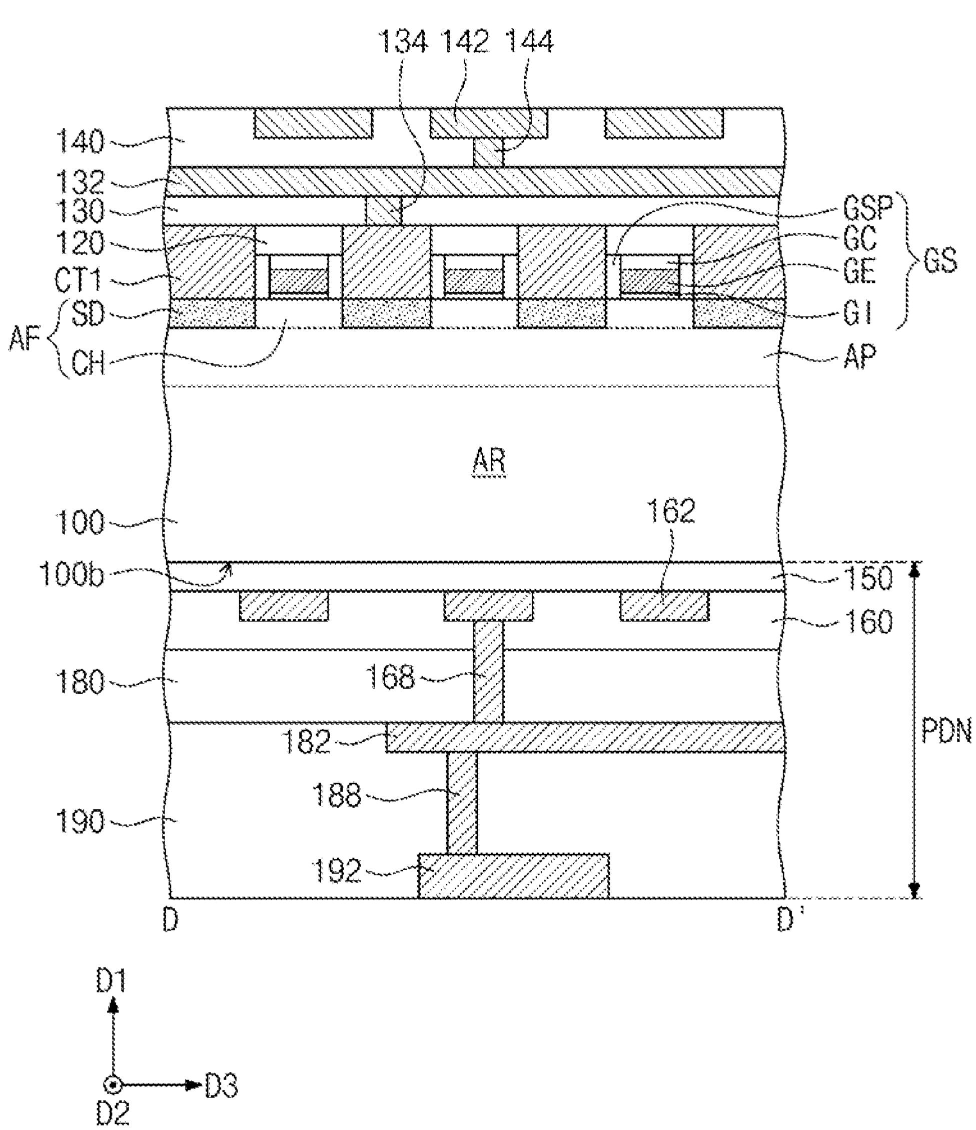

FIG. 1 is a plan view illustrating a semiconductor device according to an embodiment. FIGS. 2A, 2B, 2C, and 2D are sectional views, which are respectively taken along lines A-A', B-B', C-C', and D-D' of FIG. 1.

Referring to FIGS. 1 and 2A to 2D, a semiconductor substrate 100 having a first surface 100*a* and a second surface 100*b*, which are opposite to each other, may be provided. The semiconductor substrate 100 may be a silicon substrate, a germanium substrate, or a silicon-germanium substrate.

A device isolation layer ST may be disposed in the semiconductor substrate 100 and adjacent to the first surface 100*a* to define active regions AR. The semiconductor substrate 100 may include the active regions AR defined by the device isolation layer ST, and the first surface 100*a* of the semiconductor substrate 100 may correspond to top surfaces of the active regions AR. The active regions AR may protrude from the semiconductor substrate 100 in a first direction D1 perpendicular to the second surface 100*b* of the semiconductor substrate 100, and the device isolation layer ST may be interposed between the active regions AR. The active regions AR may be spaced apart from each other in a second direction D2 with the device isolation layer ST interposed therebetween and may be extended in a third direction D3. The second and third directions D2 and D3 may be parallel to the second surface 100*b* of the semiconductor substrate 100 and may be non-parallel to each other. The active regions AR may be PMOSFET regions or NMOSFET regions. The device isolation layer ST may be formed of or include at least one of silicon oxide, silicon nitride, or silicon oxynitride.

A plurality of active patterns AP may protrude from a top surface of each of the active regions AR (i.e., the first surface 100*a* of the semiconductor substrate 100) in the first direction D1. The active patterns AP may be spaced apart from each other, in the second direction D2, on each active region AR and may be extended in the third direction D3. The device isolation layer ST may be extended to a region on the top surface of each of the active regions AR to cover side surfaces of the active patterns AP. The active patterns AP may be spaced apart from each other in the second direction D2, with the device isolation layer ST interposed therebetween. In an embodiment, the active patterns AP may be portions of the semiconductor substrate 100, which protrude from a top surface of each of the active regions AR (i.e., the first surface 100*a* of the semiconductor substrate 100).

Each of the active patterns AP may include an active fin AF, which protrudes above the device isolation layer ST. The active fin AF may not be covered with the device isolation layer ST. In other words, the device isolation layer ST may be provided to expose the active fin AF. The active fin AF of each of the active patterns AP may include a channel region CH and source/drain regions SD as shown, for example, in FIGS. 2B to 2D. The channel region CH may be interposed between the source/drain regions SD. The source/drain regions SD may be epitaxial patterns, which are formed by a selective epitaxial growth process, in which each active pattern AP is used as a seed layer. In an embodiment, the source/drain regions SD may be formed of or include at least one of silicon, silicon-germanium, or silicon carbide. The channel region CH may be a portion of each active pattern AP, which is interposed between the source/drain regions SD.

Gate structures GS may be formed on the first surface 100*a* of the semiconductor substrate 100 to cross the active patterns AP. The gate structures GS may be extended in the second direction D2 and may be spaced apart from each other in the third direction D3. Each of the gate structures GS may be overlapped with the channel region CH of the active fin AF of each of the active patterns AP vertically (e.g., in the first direction D1). Each of the gate structures GS may cover a top surface of the channel region CH and may cover side surfaces of the channel region CH, which are opposite to each other in the second direction D2. The source/drain regions SD may be disposed at both sides of each of the gate structures GS as shown, for example, in FIG. 2D.

Each of the gate structures GS may include a gate electrode GE, a gate insulating pattern GI between the gate electrode GE and the channel region CH, gate spacers GSP on side surfaces of the gate electrode GE, and a gate capping pattern GC on a top surface of the gate electrode GE. The gate insulating pattern GI may be extended into a region between the gate electrode GE and the gate spacers GSP, and the topmost surface of the gate insulating pattern GI may be substantially coplanar with the top surface of the gate electrode GE. The gate electrode GE may cover a top surface of the channel region CH, may cover side surfaces of the channel region CH, which are opposite to each other in the second direction D2, and may be extended to a region on a top surface of the device isolation layer ST. The gate insulating pattern GI may be interposed between the gate electrode GE and a top surface of the channel region CH and each of side surfaces of the channel region CH, which are opposite to each other in the second direction D2, and may be extended into a space between the top surface of the device isolation layer ST and the gate electrode GE.

In an embodiment, the gate electrode GE, the channel region CH, and the source/drain regions SD may constitute a fin field effect transistor. In an embodiment, the channel region CH may include a plurality of semiconductor patterns, which are spaced apart from each other in the first direction D1, and in this case, the gate electrode GE, the channel region CH, and the source/drain regions SD may constitute a multi-bridge channel field effect transistor.

The gate electrode GE may be formed of or include at least one of doped semiconductor materials, conductive metal nitride materials, and/or metallic materials. The gate insulating pattern GI may be formed of or include at least one of silicon oxide, silicon nitride, silicon oxynitride, or high-k dielectric materials. The high-k dielectric materials may include materials (e.g., hafnium oxide (HfO), aluminum oxide (AlO), or tantalum oxide (TaO)) having higher dielectric constants than silicon oxide. Each of the gate spacers GSP and the gate capping pattern GC may be formed of or include at least one of silicon oxide, silicon nitride, or silicon oxynitride.

A first upper interlayer insulating layer 110 may be disposed on the first surface 100*a* of the semiconductor substrate 100 to cover the gate structure GS and the source/drain regions SD. The first upper interlayer insulating layer 110 may cover a top surface of the device isolation layer ST. A top surface of the first upper interlayer insulating layer 110 may be substantially coplanar with a top surface of the gate capping pattern GC. The gate spacer GSP may be interposed between the gate capping pattern GC and the first upper interlayer insulating layer 110. A second upper interlayer insulating layer 120 may be disposed on the first upper interlayer insulating layer 110. The second upper interlayer insulating layer 120 may cover a top surface of the gate capping pattern GC. The first and second upper interlayer insulating layers 110 and 120 may be formed of or include at least one of silicon oxide, silicon nitride, silicon oxynitride, or low-k dielectric materials.

Source/drain contacts CT1 may be provided to penetrate the first and second upper interlayer insulating layers 110 and 120 and may be electrically connected to the source/drain regions SD. The source/drain contacts CT1 may be disposed at both sides of each gate structure GS and may have a bar shape extended in the second direction D2. Each of the source/drain contacts CT1 may be connected to a plurality of source/drain regions SD, which are spaced apart from each other in the second direction D2 as shown, for example, in FIG. 2A.

As shown, for example, in FIG. 1, gate contacts CT2 may be disposed in the second upper interlayer insulating layer 120. Each of the gate contacts CT2 may be provided to penetrate the second upper interlayer insulating layer 120 and the gate capping pattern GC and may be connected to the gate electrode GE. The source/drain contacts CT1 and the gate contacts CT2 may have top surfaces that are substantially coplanar with a top surface of the second upper interlayer insulating layer 120. In an embodiment, the top surfaces of the source/drain contacts CT1 and the gate contacts CT2 may be located at substantially the same height as the top surface of the second upper interlayer insulating layer 120, when measured from the first surface 100*a* of the semiconductor substrate 100. The source/drain contacts CT1 and the gate contacts CT2 may be formed of or include the same conductive material. The source/drain contacts CT1 and the gate contacts CT2 may be formed of or include at least one of metallic materials (e.g., aluminum, copper, tungsten, molybdenum, and cobalt).

A third upper interlayer insulating layer 130 may be disposed on the second upper interlayer insulating layer 120 to cover top surfaces of the source/drain contacts CT1 and the gate contacts CT2. First upper interconnection lines 132 and first upper vias 134 may be disposed in the third upper interlayer insulating layer 130. The first upper interconnection lines 132 may be provided to penetrate an upper portion of the third upper interlayer insulating layer 130, and top surfaces of the first upper interconnection lines 132 may be substantially coplanar with a top surface of the third upper interlayer insulating layer 130. In other words, the top surfaces of the first upper interconnection lines 132 may be located at substantially the same height as the top surface of the third upper interlayer insulating layer 130, when measured from the first surface 100*a* of the semiconductor substrate 100. The first upper vias 134 may be disposed between the source/drain contacts CT1 and the first upper interconnection lines 132 and between the gate contacts CT2 and the first upper interconnection lines 132 in the first direction D1, and may penetrate a lower portion of the third upper interlayer insulating layer 130 in the first direction D1. Each of the source/drain contacts CT1 and the gate contacts CT2 may be electrically connected to a corresponding one of the first upper interconnection lines 132 through a corresponding one of the first upper vias 134.

In an embodiment, a power rail POR may be disposed in the third upper interlayer insulating layer 130. The power rail POR may be located at substantially the same height as the first upper interconnection lines 132, when measured from the first surface 100*a* of the semiconductor substrate 100. The power rail POR may be provided to cross the gate structures GS and to have a line shape extending in the third direction D3. The first upper vias 134 may be disposed between the source/drain contacts CT1 and the power rail POR, and at least one of the source/drain contacts CT1 may be electrically connected to the power rail POR through a corresponding one of the first upper vias 134. In other embodiment, although not illustrated, the power rail POR may be buried in the device isolation layer ST. In this case, at least one of the source/drain contacts CT1 may include an extended portion, which is extended into the device isolation layer ST, and may be electrically connected to the power rail POR through the extended portion.

A fourth upper interlayer insulating layer 140 may be disposed on the third upper interlayer insulating layer 130 to cover top surfaces of the first upper interconnection lines 132 and the power rail POR. Second upper interconnection lines 142 and second upper vias 144 may be disposed in the fourth upper interlayer insulating layer 140. The second upper interconnection lines 142 may be provided to penetrate an upper portion of the fourth upper interlayer insulating layer 140, and top surfaces of the second upper interconnection lines 142 may be substantially coplanar with a top surface of the fourth upper interlayer insulating layer 140. In other words, the top surfaces of the second upper interconnection lines 142 may be located at substantially the same height as the top surface of the fourth upper interlayer insulating layer 140, when measured from the first surface 100*a* of the semiconductor substrate 100. The second upper vias 144 may be disposed between the first and second upper interconnection lines 132 and 142 and between the power rail POR and the second upper interconnection lines 142 and may penetrate a lower portion of the fourth upper interlayer insulating layer 140. Each of the first upper interconnection lines 132 and the power rail POR may be electrically connected to a corresponding one of the second upper interconnection lines 142 through a corresponding one of the second upper vias 144.

The third and fourth upper interlayer insulating layers 130 and 140 may be formed of or include at least one of silicon oxide, silicon nitride, silicon oxynitride, or low-k dielectric materials. The first and second upper interconnection lines 132 and 142, the power rail POR, and the first and second upper vias 134 and 144 may be formed of or include at least one of metallic materials or conductive metal nitride materials.

A penetration via 200 may be provided to penetrate the semiconductor substrate 100 and may be connected to the power rail POR. In an embodiment, the penetration via 200 may penetrate the device isolation layer ST, the first upper interlayer insulating layer 110, the second upper interlayer insulating layer 120, and a lower portion of the third upper interlayer insulating layer 130 and may be connected to or in contact with a bottom surface of the power rail POR. In an embodiment, the power rail POR may be buried in the device isolation layer ST, and in this case, the penetration via 200 may penetrate the semiconductor substrate 100 and may be connected to or in contact with the bottom surface of the power rail POR. The penetration via 200 may be formed of or include at least one of conductive materials (e.g., metallic materials and/or conductive metal nitride materials).

A power delivery network PDN may be disposed on the second surface 100*b* of the semiconductor substrate 100. The power delivery network PDN may include lower contacts 152, first lower interconnection lines 162, first lower vias 168, second lower interconnection lines 182, second lower vias 188, and third lower interconnection lines 192, which are disposed on the second surface 100*b* of the semiconductor substrate 100.

The first lower interconnection lines 162 may be spaced apart from the second surface 100*b* of the semiconductor substrate 100 in a direction (e.g., the first direction D1) perpendicular to the second surface 100*b* of the semiconductor substrate 100, and the lower contacts 152 may be disposed between the second surface 100*b* of the semiconductor substrate 100 and the first lower interconnection lines 162. The lower contacts 152 may be electrically connected to the first lower interconnection lines 162. The power delivery network PDN may further include a lower insulating layer 150, which is disposed on the second surface 100*b* of the semiconductor substrate 100 to cover the lower contacts 152. The first lower interconnection lines 162 may be disposed on the lower insulating layer 150 and may be extended in a direction (e.g., the second direction D2) parallel to the second surface 100*b* of the semiconductor substrate 100. Each of the lower contacts 152 may be provided to penetrate the lower insulating layer 150 and may be electrically connected to a corresponding one of the first lower interconnection lines 162.

The second lower interconnection lines 182 may be spaced apart from the first lower interconnection lines 162 in a direction (e.g., the first direction D1) perpendicular to the second surface 100*b* of the semiconductor substrate 100, and the first lower vias 168 may be disposed between the first lower interconnection lines 162 and the second lower interconnection lines 182. The first lower vias 168 may electrically connect the first lower interconnection lines 162 to the second lower interconnection lines 182. The power delivery network PDN may further include a first lower interlayer insulating layer 160 and a second lower interlayer insulating layer 180, which are sequentially stacked on the lower insulating layer 150. The first lower interlayer insulating layer 160 may be disposed between the lower insulating layer 150 and the second lower interlayer insulating layer 180 and may cover the first lower interconnection lines 162. The second lower interconnection lines 182 may be disposed on the second lower interlayer insulating layer 180 and may be extended in a direction (e.g., the second direction D2) parallel to the second surface 100*b* of the semiconductor substrate 100. Each of the first lower vias 168 may be provided to penetrate the first lower interlayer insulating layer 160 and the second lower interlayer insulating layer 180 and may be extended in a direction (e.g., the first direction D1) perpendicular to the second surface 100*b* of the semiconductor substrate 100. Each of the first lower vias 168 may be electrically connected to a corresponding one of the first lower interconnection lines 162 and a corresponding one of the second lower interconnection lines 182.

The third lower interconnection lines 192 may be spaced apart from the second lower interconnection lines 182 in a direction (e.g., the first direction D1) perpendicular to the second surface 100*b* of the semiconductor substrate 100, and the second lower vias 188 may be disposed between the second and third lower interconnection lines 182 and 192. The second lower vias 188 may electrically connect the second lower interconnection lines 182 to the third lower interconnection lines 192. The power delivery network PDN may further include a third lower interlayer insulating layer 190, which is disposed on the second lower interlayer insulating layer 180 to cover the second lower interconnection lines 182, the second lower vias 188, and the third lower interconnection lines 192. The third lower interconnection lines 192 may be extended in a direction (e.g., the second direction D2) parallel to the second surface 100*b* of the semiconductor substrate 100. Each of the second lower vias 188 may be provided to penetrate the third lower interlayer insulating layer 190 and may be extended in a direction (e.g., the first direction D1) perpendicular to the second surface 100*b* of the semiconductor substrate 100. Each of the second lower vias 188 may be electrically connected to a corresponding one of the second lower interconnection lines 182 and a corresponding one of the third lower interconnection lines 192.

The lower contacts 152, the first lower interconnection lines 162, the first lower vias 168, the second lower interconnection lines 182, the second lower vias 188, and the third lower interconnection lines 192 may be formed of or include at least one of conductive materials (e.g., metallic materials, such as copper, and/or conductive metal nitride materials). The lower insulating layer 150 and the first, second, and third lower interlayer insulating layers 160, 180, and 190 may be formed of or include at least one of silicon oxide, silicon nitride, silicon oxynitride, or low-k dielectric materials.

The power delivery network PDN may further include additional lower interconnection lines, which are spaced apart from the third lower interconnection lines 192 in a direction (e.g., the first direction D1) perpendicular to the second surface 100*b* of the semiconductor substrate 100, and additional lower vias, which are provided between the third lower interconnection lines 192 and the additional lower interconnection lines.

The power delivery network PDN may further include at least one capacitor 170, which is disposed between the first lower interconnection lines 162 and the second lower interconnection lines 182, between the second and third lower interconnection lines 182 and 192, and/or between the first lower interconnection lines 162 and the third lower interconnection lines 192. In an embodiment, as shown in FIG. 2A, the at least one capacitor 170 may be disposed between the first lower interconnection lines 162 and the second lower interconnection lines 182.

In an embodiment, the capacitor 170 may be disposed between a corresponding one of the first lower interconnection lines 162 and a corresponding one of the second lower interconnection lines 182 and may be electrically connected to the corresponding first lower interconnection line 162 and the corresponding second lower interconnection line 182. The capacitor 170 may be disposed on the first lower interlayer insulating layer 160, and the second lower interlayer insulating layer 180 may cover the capacitor 170.

The capacitor 170 may include a first electrode 172, a second electrode 176, and a dielectric layer 174 therebetween. The first electrode 172, the dielectric layer 174, and the second electrode 176 may be sequentially stacked on the first lower interlayer insulating layer 160 in a direction (e.g., the first direction D1) perpendicular to the second surface 100*b* of the semiconductor substrate 100 and may be extended in a direction (e.g., the second direction D2) parallel to the second surface 100*b* of the semiconductor substrate 100. Accordingly, the capacitor 170 may have a plate shape extending in a direction (e.g., the second direction D2) parallel to the second surface 100*b* of the semiconductor substrate 100. The corresponding first lower interconnection line 162, the capacitor 170, and the corresponding second lower interconnection line 182 may be extended in a direction (e.g., the second direction D2) parallel to the second surface 100*b* of the semiconductor substrate 100. Each of the first and second electrodes 172 and 176 may be formed of or include a conductive material (e.g., a metallic material), and the dielectric layer 174 may be formed of or include a dielectric material (e.g., a ceramic material).

The power delivery network PDN may further include a first electrode contact 164 between the first electrode 172 of the capacitor 170 and the corresponding first lower interconnection line 162 and a second electrode contact 166 between the second electrode 176 of the capacitor and the corresponding second lower interconnection line 182. The first electrode contact 164 may be provided to penetrate the first lower interlayer insulating layer 160 and to electrically connect the first electrode 172 of the capacitor 170 to the corresponding first lower interconnection line 162. The second electrode contact 166 may be provided to penetrate the second lower interlayer insulating layer 180 and to electrically connect the second electrode 176 of the capacitor to the corresponding second lower interconnection line 182. The first electrode contact 164 and the second electrode contact 166 may be formed of or include at least one of conductive materials (e.g., metallic materials and/or conductive metal nitride materials).

The penetration via 200 may be provided to penetrate the semiconductor substrate 100 and may be connected to the power rail POR and the power delivery network PDN. The penetration via 200 may be connected to a corresponding one of the lower contacts 152 of the power delivery network PDN and may be vertically extended in the first direction D1 to be connected to a bottom surface of the power rail POR. The power delivery network PDN may apply a power voltage (VDD) or a ground voltage (VSS) to the power rail POR through the penetration via 200. The power rail POR may apply a power voltage (VDD) or a ground voltage (VSS) to a corresponding one of the source/drain contacts CT1.

In an embodiment, the power delivery network PDN may be disposed on the second surface 100*b* of the semiconductor substrate 100 and may be electrically connected to the power rail POR, which is disposed on the first surface 100*a* of the semiconductor substrate 100, through the penetration via 200. Accordingly, it may be possible to easily increase an integration density of the semiconductor device. In addition, the power delivery network PDN may include the at least one capacitor 170, which is disposed between the first lower interconnection lines 162 and the second lower interconnection lines 182, between the second and third lower interconnection lines 182 and 192, and/or between the first lower interconnection lines 162 and the third lower interconnection lines 192. The capacitor 170 may be used as a decoupling capacitor, and thus, a power integrity property of the power delivery network PDN may be improved. Accordingly, the semiconductor device with an increased integration density and improved electric characteristics may be provided.

Figure 3A:
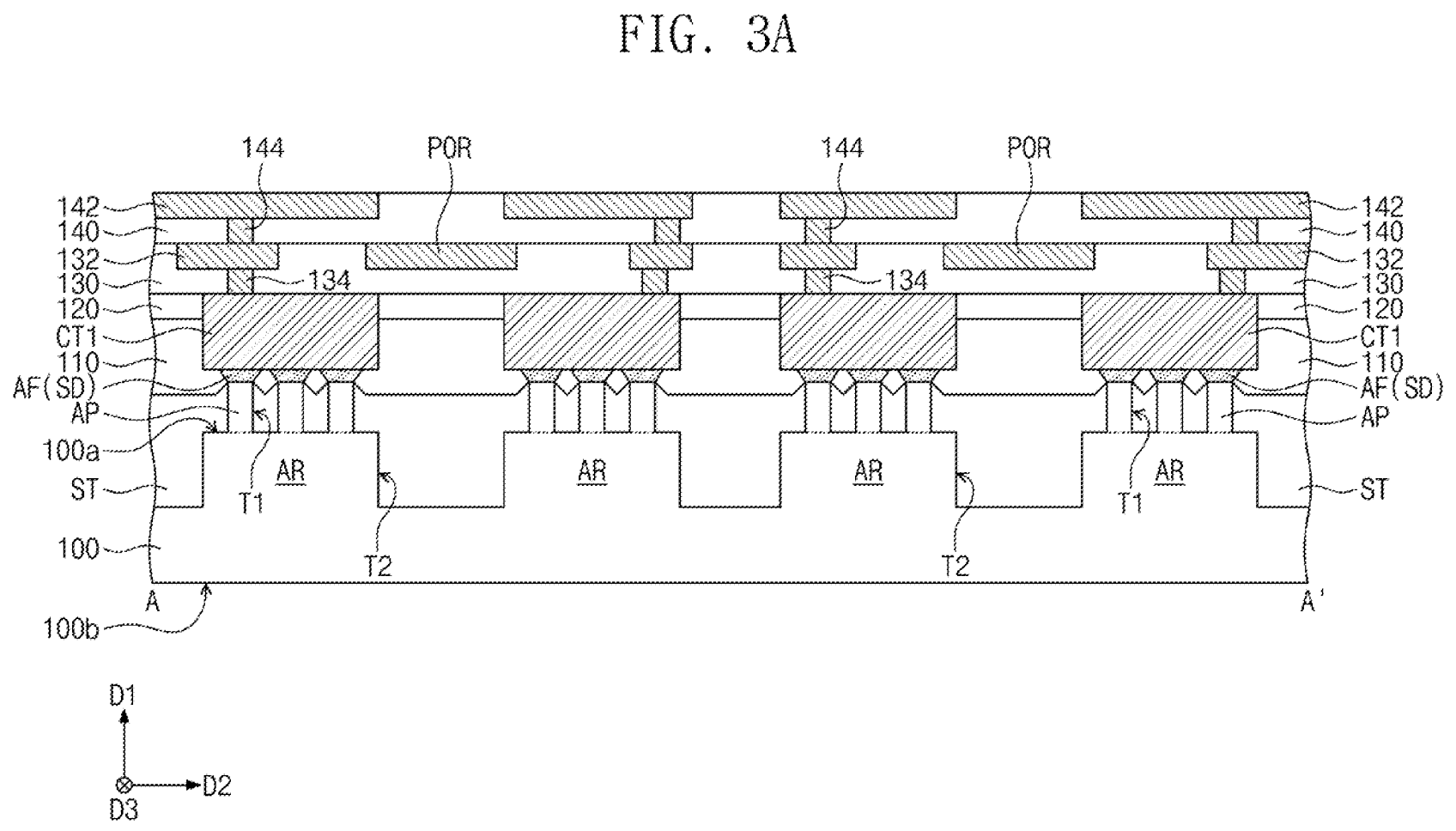
Figure 3B:
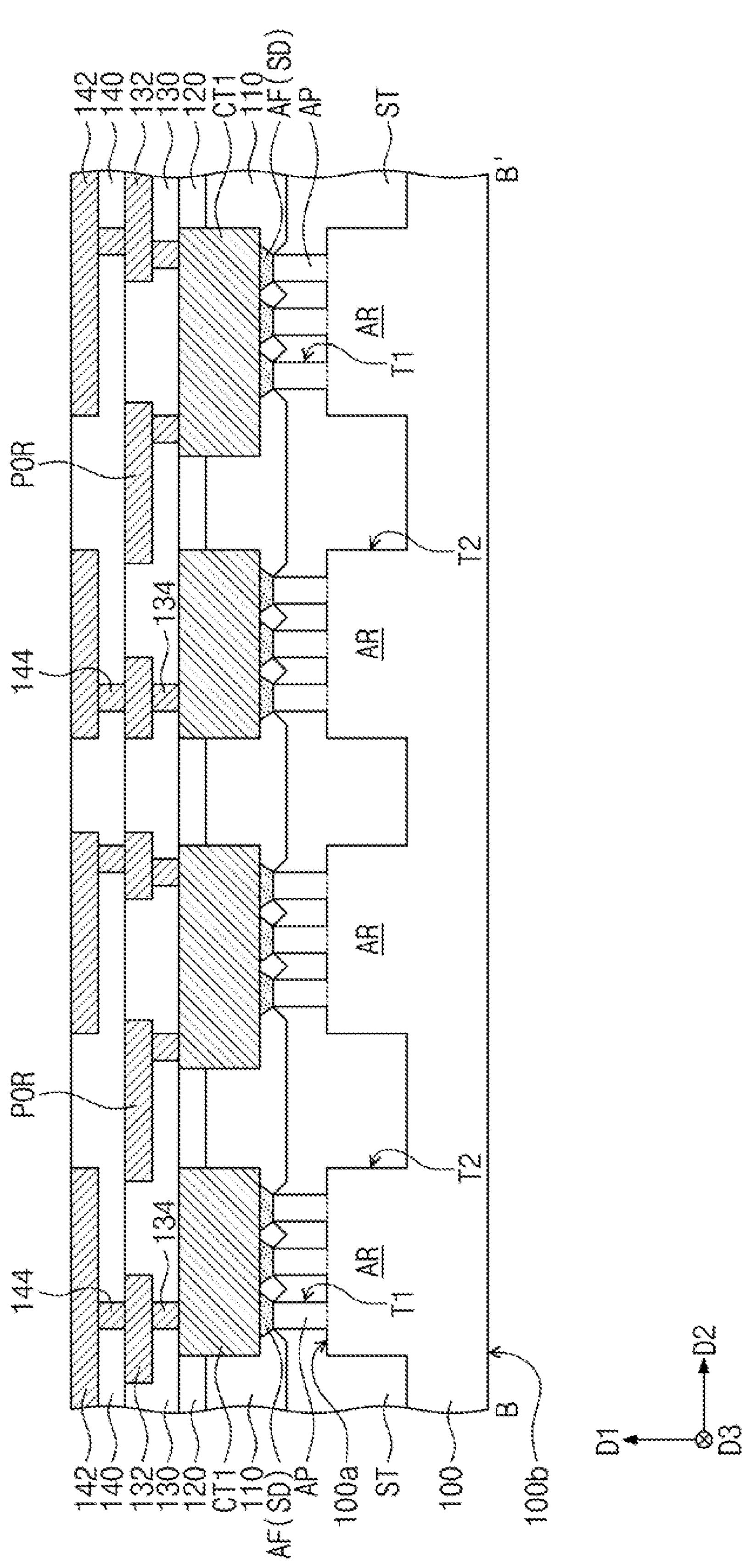
Figure 3C:
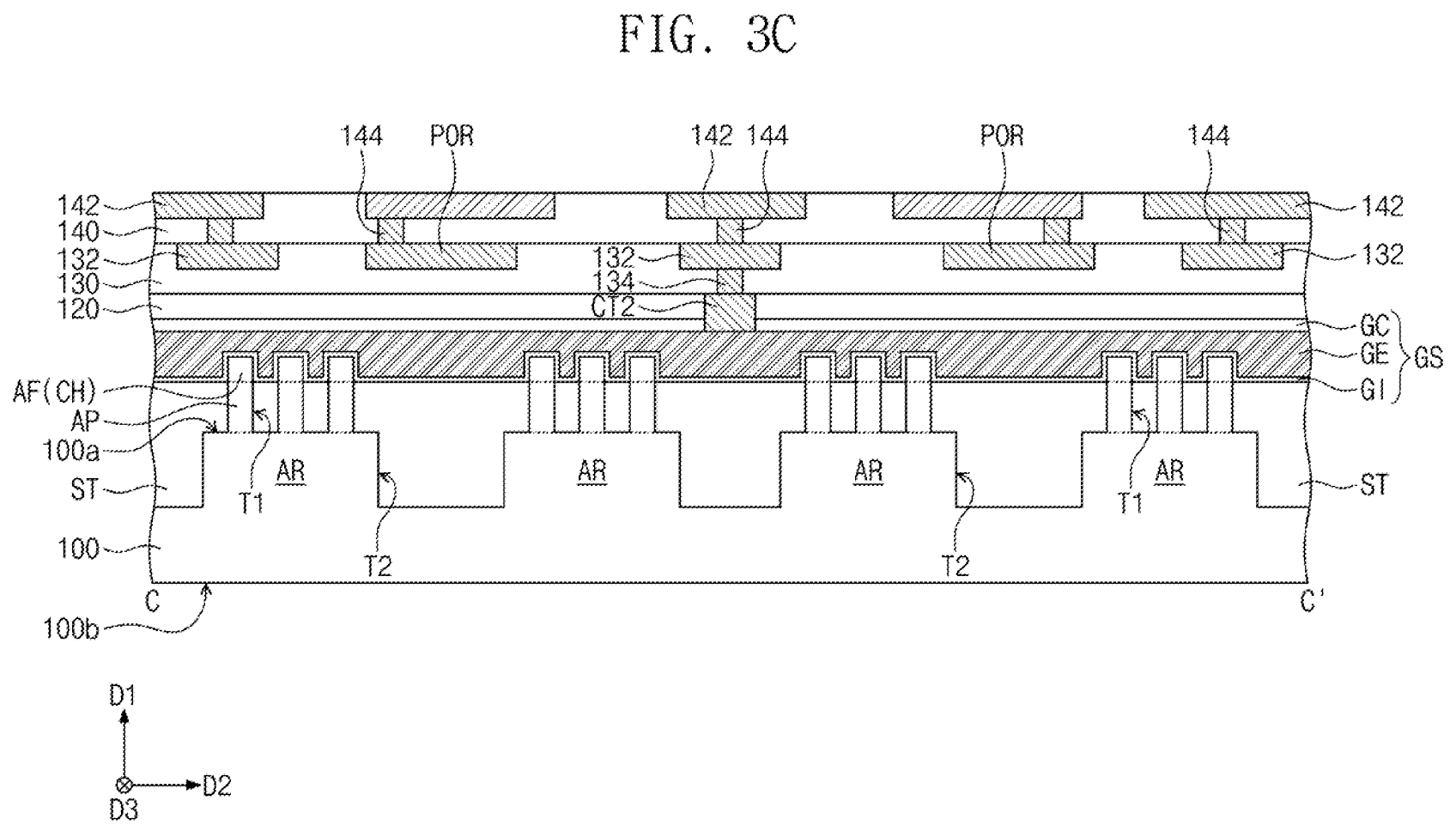
Figure 3D:
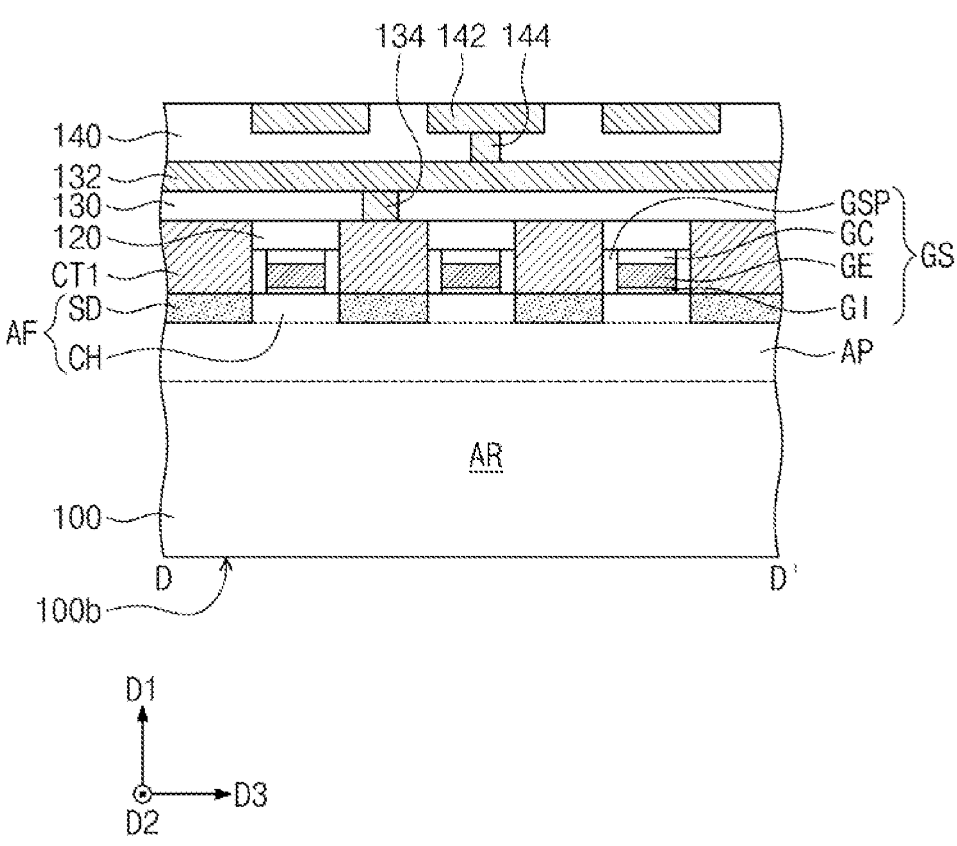
Figure 4A:
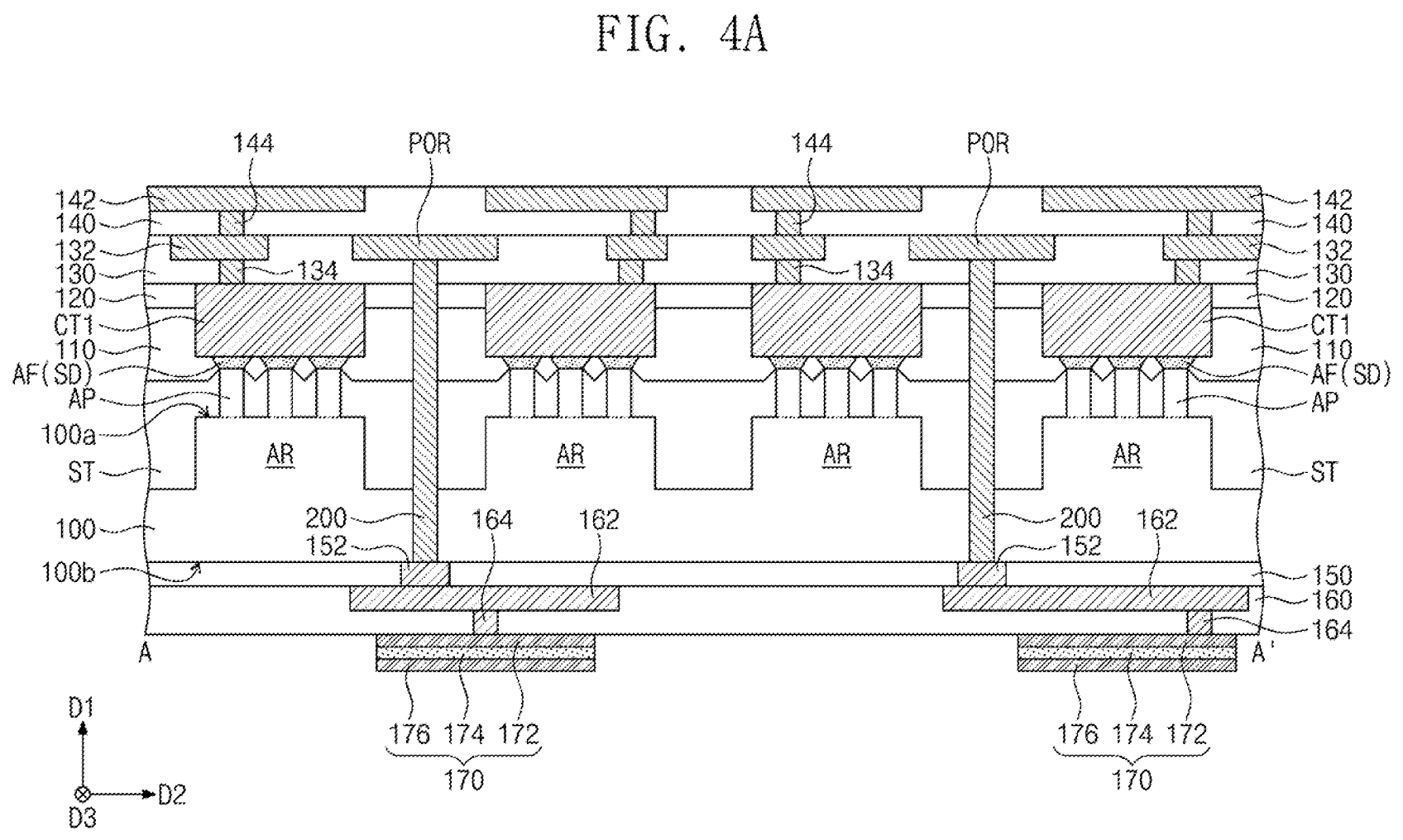
Figure 4B:
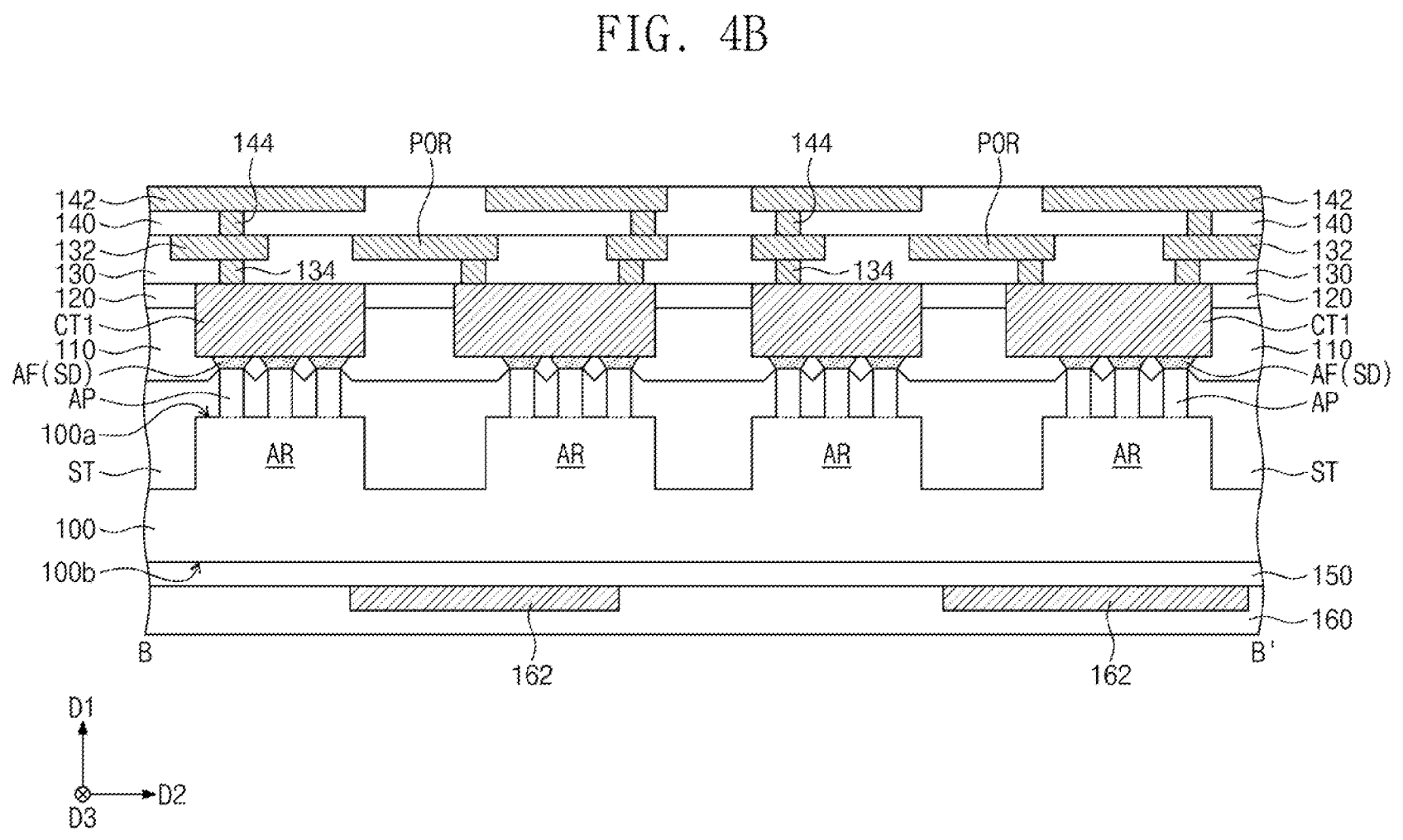
Figure 4C:
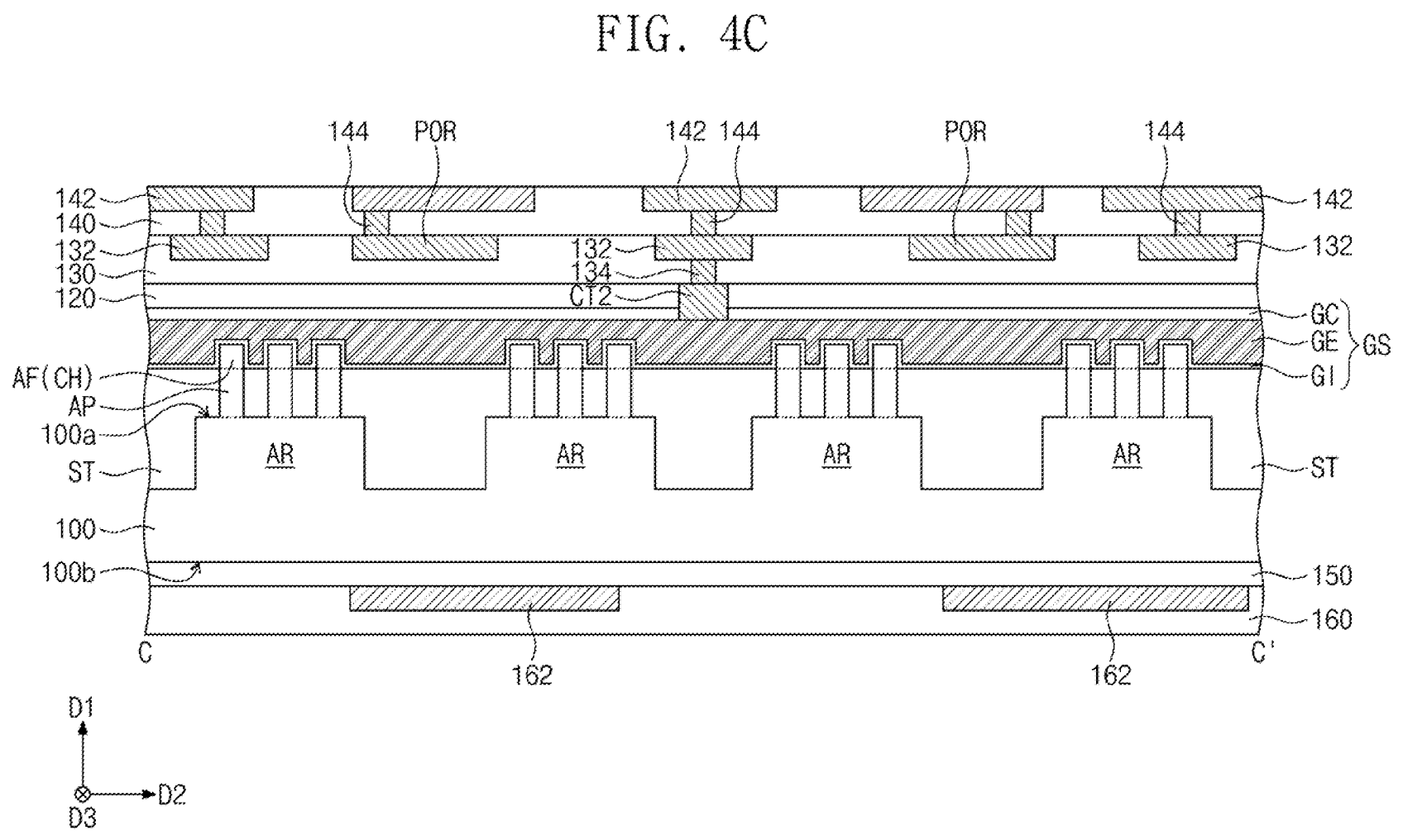
Figure 4D:
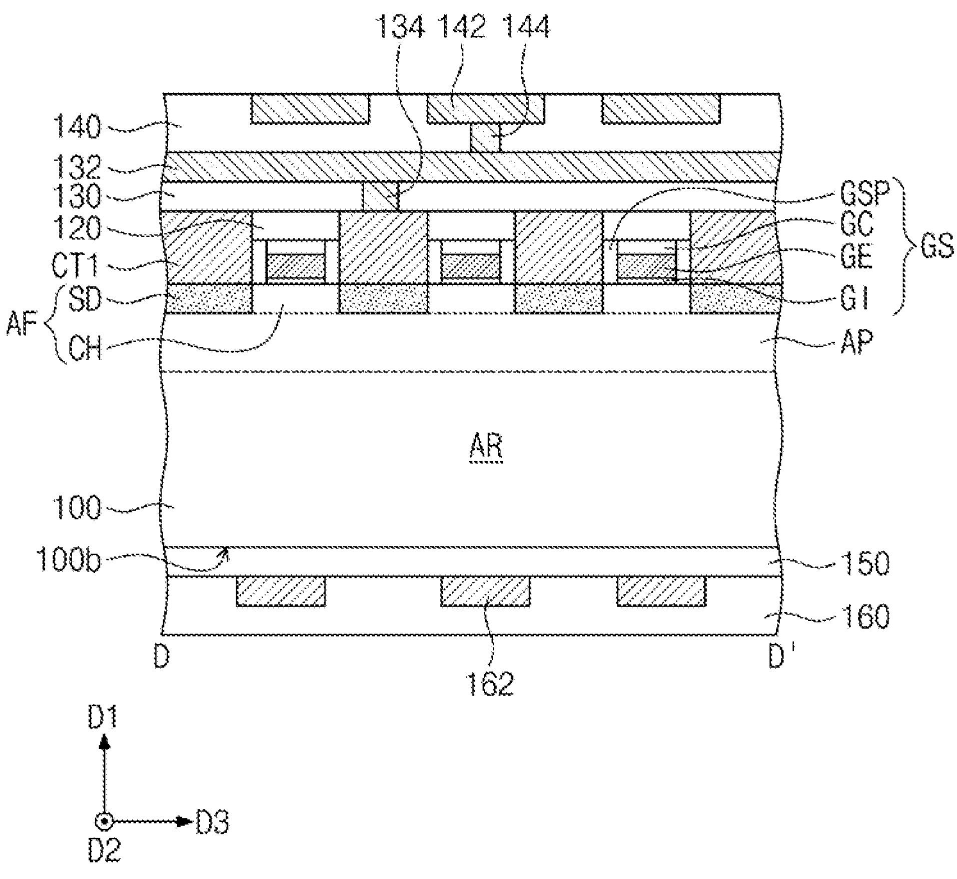

FIGS. 3A to 3D and 4A to 4D are sectional views illustrating a method of fabricating a semiconductor device according to an embodiment. FIGS. 3A and 4A are sectional views taken along the line A-A' of FIG. 1, FIGS. 3B and 4B are sectional views taken along the line B-B' of FIG. 1, FIGS. 3C and 4C are sectional views taken along the line C-C' of FIG. 1, and FIGS. 3D and 4D are sectional views taken along the line D-D' of FIG. 1. For concise description, an element previously described with reference to FIGS. 1 and 2A to 2D may be identified by the same reference number without repeating an overlapping description thereof.

Referring to FIGS. 1 and 3A to 3D, a semiconductor substrate 100 may be provided. First trenches T1 may be formed by patterning an upper portion of the semiconductor substrate 100. The first trenches T1 may define a plurality of active patterns AP in an upper portion of the semiconductor substrate 100. The plurality of active patterns AP may be extended in the third direction D3 and may be spaced apart from each other in the second direction D2.

Second trenches T2 may be formed by patterning an upper portion of the semiconductor substrate 100. The second trenches T2 may be formed in the semiconductor substrate 100 to have a depth larger than the first trenches T1. The second trenches T2 may define active regions AR in an upper portion of the semiconductor substrate 100. The active regions AR may be extended in the third direction D3 and may be spaced apart from each other in the second direction D2. The plurality of active patterns AP may be disposed on the active regions AR. Each of the active patterns AP may protrude from a top surface (i.e., a first surface 100*a* of the semiconductor substrate 100) of a corresponding one of the active regions AR in the first direction D1.

A device isolation layer ST may be formed to cover the active patterns AP and the active regions AR and to cover the first and second trenches T1 and T2. The device isolation layer ST may be recessed until upper portions of the active patterns AP are exposed. The upper portion of each active pattern AP, which is exposed by the device isolation layer ST, may be referred to as an active fin AF. A channel region CH and source/drain regions SD may be formed in the active fin AF. In an embodiment, the formation of the source/drain regions SD may include recessing portions of the active fin AF at both sides of the channel region CH and performing an epitaxial growth process on the recessed regions of the active fin AF. The channel region CH may be a portion of the active fin AF, which is interposed between the source/drain regions SD.

A first upper interlayer insulating layer 110 may be formed to cover the source/drain regions SD, and gate structures GS may be formed in the first upper interlayer insulating layer 110. The gate structures GS may be formed to cross the active patterns AP. Each gate structure GS may be formed to cross the active fin AF of a corresponding one of the active patterns AP and to be vertically overlapped with the channel region CH. Each of the gate structures GS may cover a top surface of the channel region CH and may cover side surfaces of the channel region CH, which are opposite to each other in the second direction D2. The source/drain regions SD may be disposed at both sides of each of the gate structures GS.

In an embodiment, the formation of the gate structures GS may include forming an empty region in the first upper interlayer insulating layer 110 to expose the channel region CH and forming a gate insulating pattern GI, a gate electrode GE, a gate capping pattern GC, and gate spacers GSP in the empty region. A second upper interlayer insulating layer 120 may be formed on the first upper interlayer insulating layer 110 to cover the gate structures GS.

Source/drain contacts CT1 may be formed in the first and second upper interlayer insulating layers 110 and 120. The source/drain contacts CT1 may be provided to penetrate the first and second upper interlayer insulating layers 110 and 120 and may be electrically connected to the source/drain regions SD. Gate contacts CT2 may be formed in the second upper interlayer insulating layer 120. Each of the gate contacts CT2 may be provided to penetrate the second upper interlayer insulating layer 120 and the gate capping pattern GC and may be electrically connected to the gate electrode GE. In an embodiment, the formation of the source/drain contacts CT1 and the gate contacts CT2 may include forming source/drain contact holes to penetrate the first and second upper interlayer insulating layers 110 and 120 and to expose the source/drain regions SD, forming gate contact holes to penetrate the second upper interlayer insulating layer 120 and the gate capping pattern GC and to expose the gate electrode GE, forming a conductive layer to fill the source/drain contact holes and the gate contact holes, and planarizing the conductive layer to expose a top surface of the second upper interlayer insulating layer 120.

A third upper interlayer insulating layer 130 may be formed on the second upper interlayer insulating layer 120, and first upper interconnection lines 132 and first upper vias 134 may be formed in the third upper interlayer insulating layer 130. In an embodiment, a power rail POR may be formed in the third upper interlayer insulating layer 130 and may be formed at substantially the same level as the first upper interconnection lines 132, when measured from the first surface 100*a* of the semiconductor substrate 100. A fourth upper interlayer insulating layer 140 may be formed on the third upper interlayer insulating layer 130, and second upper interconnection lines 142 and second upper vias 144 may be formed in the fourth upper interlayer insulating layer 140. Additional upper interlayer insulating layers, additional upper interconnection lines, and additional upper vias may be formed on the fourth upper interlayer insulating layer 140.

The semiconductor substrate 100 may have a second surface 100*b*, which is opposite to top surfaces of the active regions AR (i.e., a first surface 100*a* of the semiconductor substrate 100). An etching process may be performed on the second surface 100*b* of the semiconductor substrate 100 to remove a lower portion of the semiconductor substrate 100. The etching process may be performed until the semiconductor substrate 100 has a desired thickness (i.e., a distance between the first and second surfaces 100*a* and 100*b* in the first direction D1).

Referring to FIGS. 1 and 4A to 4D, a penetration via 200 may be formed to penetrate the semiconductor substrate 100, the device isolation layer ST, the first and second upper interlayer insulating layers 110 and 120, and a lower portion of the third upper interlayer insulating layer 130 and may be connected to a bottom surface of the power rail POR. In an embodiment, the formation of the penetration via 200 may include forming a mask pattern (e.g., a photoresist pattern) on the second surface 100*b* of the semiconductor substrate 100 to define a position and shape of the penetration via 200, etching the semiconductor substrate 100, the device isolation layer ST, the first and second upper interlayer insulating layers 110, 120, and the lower portion of the third upper interlayer insulating layer 130 using the mask pattern as an etch mask to form a penetration hole, forming a conductive layer on the second surface 100*b* of the semiconductor substrate 100 to fill the penetration hole, and planarizing the conductive layer to expose the second surface 100*b* of the semiconductor substrate 100.

A lower insulating layer 150 may be formed to cover the second surface 100*b* of the semiconductor substrate 100, and lower contacts 152 may be formed in the lower insulating layer 150. The penetration via 200 may be electrically connected to a corresponding one of the lower contacts 152.

First lower interconnection lines 162 may be formed on the lower insulating layer 150 and may be electrically connected to the lower contacts 152. First lower interlayer insulating layer 160 may be formed on the lower insulating layer 150 and may cover the first lower interconnection lines 162.

In an embodiment, at least one capacitor 170 may be formed on the first lower interlayer insulating layer 160. The capacitor 170 may include a first electrode 172, a dielectric layer 174, and a second electrode 176 sequentially stacked on the first lower interlayer insulating layer 160. In an embodiment, the formation of the capacitor 170 may include sequentially depositing a first electrode layer, a dielectric layer, and a second electrode layer on the first lower interlayer insulating layer 160, and patterning the first electrode layer, the dielectric layer, and the second electrode layer to form the first electrode 172, the dielectric layer 174 and the second electrode 176.

A first electrode contact 164 may be formed in the first lower interlayer insulating layer 160 and between the first electrode 172 of the capacitor 170 and a corresponding one of the first lower interconnection lines 162. The first electrode 172 of the capacitor 170 may be electrically connected to the corresponding first lower interconnection line 162 through the first electrode contact 164.

Referring back to FIGS. 1 and 2A to 2D, a second lower interlayer insulating layer 180 may be formed on the first lower interlayer insulating layer 160 to cover the capacitor 170. Second lower interconnection lines 182 may be formed on the second lower interlayer insulating layer 180. A second electrode contact 166 may be formed in the second lower interlayer insulating layer 180 and between the second electrode 176 of the capacitor 170 and a corresponding one of the second lower interconnection lines 182. The second electrode 176 of the capacitor 170 may be electrically connected to the corresponding second lower interconnection line 182 through the second electrode contact 166.

First lower vias 168 may be formed in the first and second lower interlayer insulating layers 160 and 180 and between the first lower interconnection lines 162 and the second lower interconnection lines 182. Each of the first lower vias 168 may be provided to penetrate the first lower interlayer insulating layer 160 and the second lower interlayer insulating layer 180 and may be electrically connected to a corresponding one of the first lower interconnection lines 162 and a corresponding one of the second lower interconnection lines 182.

A third lower interlayer insulating layer 190 may be formed on the second lower interlayer insulating layer 180 to cover the second lower interconnection lines 182. Second lower vias 188 and third lower interconnection lines 192 may be formed in the third lower interlayer insulating layer 190. The second lower vias 188 may be formed between the second and third lower interconnection lines 182 and 192. Each of the second lower vias 188 may be electrically connected to a corresponding one of the second lower interconnection lines 182 and a corresponding one of the third lower interconnection lines 192.

The lower contacts 152, the first lower interconnection lines 162, the first lower vias 168, the second lower interconnection lines 182, the second lower vias 188, the third lower interconnection lines 192, the at least one capacitor 170, the first and second electrode contacts 164 and 166, the lower insulating layer 150, and the first, second, and third lower interlayer insulating layers 160, 180, and 190 may constitute a power delivery network PDN.

Figure 5:
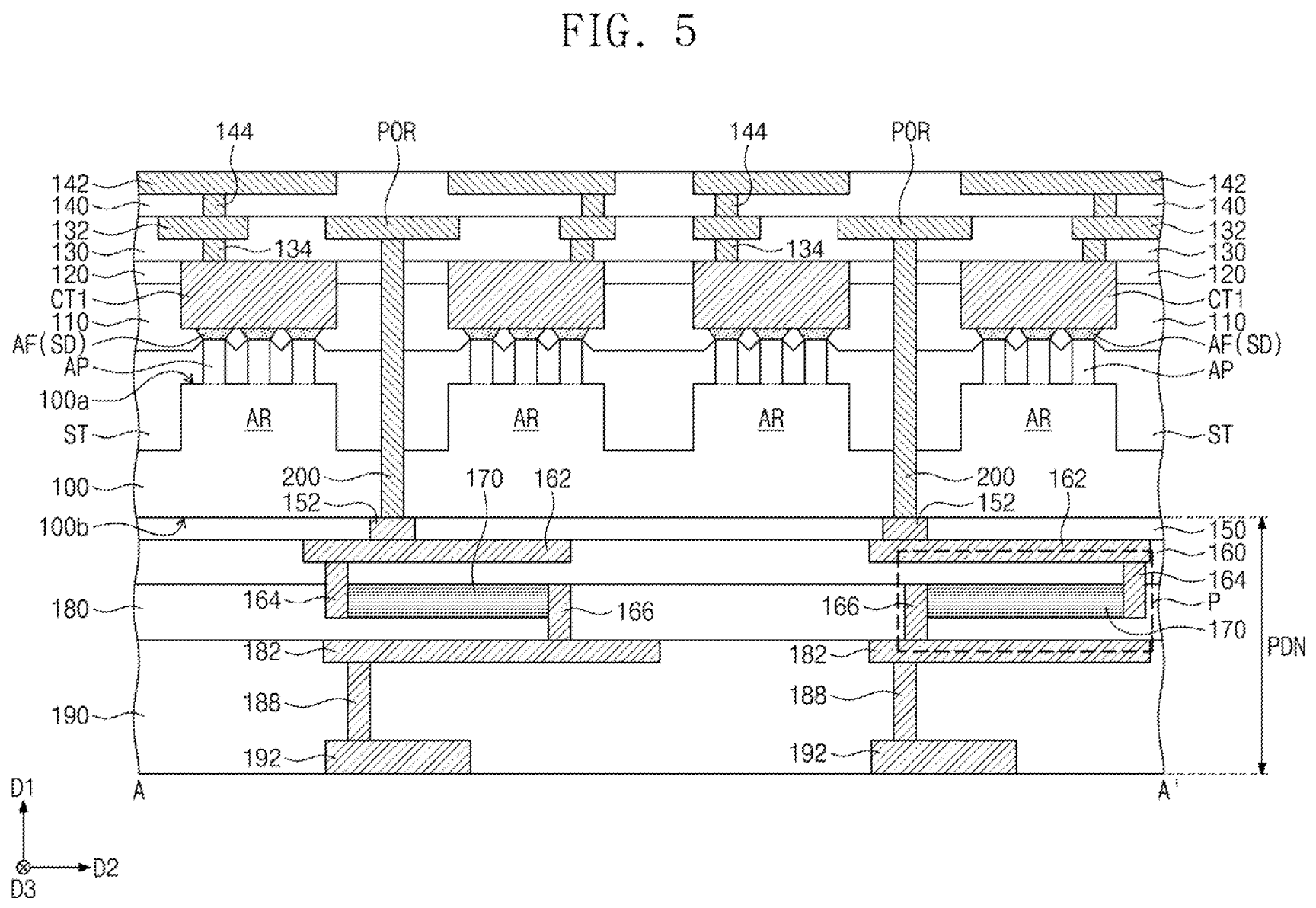
Figure 6:
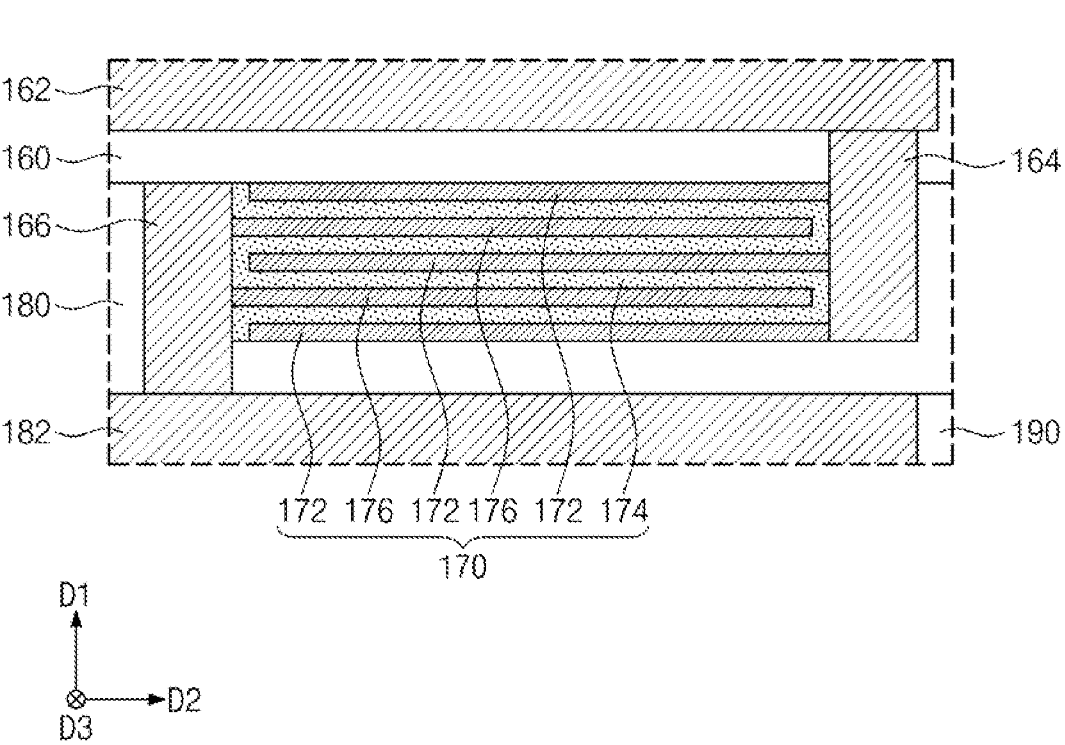
FIG. 6 is an enlarged view illustrating a portion 'P' of FIG. 5.

FIG. 5 is a sectional view, which is taken along the line A-A' of FIG. 1 to illustrate a semiconductor device according to an embodiment. FIG. 6 is an enlarged view illustrating a portion 'P' of FIG. 5. For concise description, an element previously described with reference to FIGS. 1 and 2A to 2D may be identified by the same reference number without repeating an overlapping description thereof.

Referring to FIGS. 5 and 6, in an embodiment, the at least one capacitor 170 may be disposed between the first lower interconnection lines 162 and the second lower interconnection lines 182. The capacitor 170 may be disposed between a corresponding one of the first lower interconnection lines 162 and a corresponding one of the second lower interconnection lines 182 and may be electrically connected to the corresponding first lower interconnection line 162 and the corresponding second lower interconnection line 182. The capacitor 170 may be disposed on the first lower interlayer insulating layer 160, and the second lower interlayer insulating layer 180 may cover the capacitor 170.

The capacitor 170 may include a plurality of first electrodes 172 and a plurality of second electrodes 176, which are alternately stacked on the first lower interlayer insulating layer 160 in a direction (e.g., the first direction D1) perpendicular to the second surface 100*b* of the semiconductor substrate 100, and a dielectric layer 174, which is interposed between the first electrodes 172 and the second electrodes 176. The first electrodes 172, the second electrodes 176, and the dielectric layer 174 may be extended in a direction (e.g., the second direction D2) parallel to the second surface 100*b* of the semiconductor substrate 100 on the first lower interlayer insulating layer 160, and thus, the capacitor 170 may have a plate shape that is extended in a direction (e.g., the second direction D2) parallel to the second surface 100*b* of the semiconductor substrate 100. The corresponding first lower interconnection line 162, the capacitor 170, and the corresponding second lower interconnection line 182 may be extended in a direction (e.g., the second direction D2) parallel to the second surface 100*b* of the semiconductor substrate 100. The first electrodes 172 may be electrically connected to the corresponding first lower interconnection line 162, and the second electrodes 176 may be electrically connected to the corresponding second lower interconnection line 182.

The power delivery network PDN may further include a first electrode contact 164, which is provided at a side of the capacitor 170 and is electrically connected to end portions of the first electrodes 172, and a second electrode contact 166, which is provided at an opposite side of the capacitor 170 and is electrically connected to end portions of the second electrodes 176. In other words, the first electrode contact 164 may be adjacent to a side of the capacitor 170 in the second direction D2 and the second electrode contact 166 may be adjacent to an opposite side of the capacitor 170 in the second direction D2. The first electrode contact 164 at the side of the capacitor 170 may be extended in a direction (e.g., the first direction D1) perpendicular to the second surface 100*b* of the semiconductor substrate 100. The end portions of the first electrodes 172 may be in contact with a side surface of the first electrode contact 164. The first electrode contact 164 may be provided to penetrate portions of the first and second lower interlayer insulating layers 160 and 180 and may be electrically connected to the corresponding first lower interconnection line 162. The second electrode contact 166 at the opposite side of the capacitor 170 may be extended in a direction (e.g., the first direction D1) perpendicular to the second surface 100*b* of the semiconductor substrate 100. The end portions of the second electrodes 176 may be in contact with a side surface of the second electrode contact 166. The second electrode contact 166 may be provided to penetrate the second lower interlayer insulating layer 180 and may be electrically connected to the corresponding second lower interconnection line 182.

In at least one embodiment, the power delivery network PDN may include the capacitor 170 having an increased electrostatic capacitance.

Figure 7:
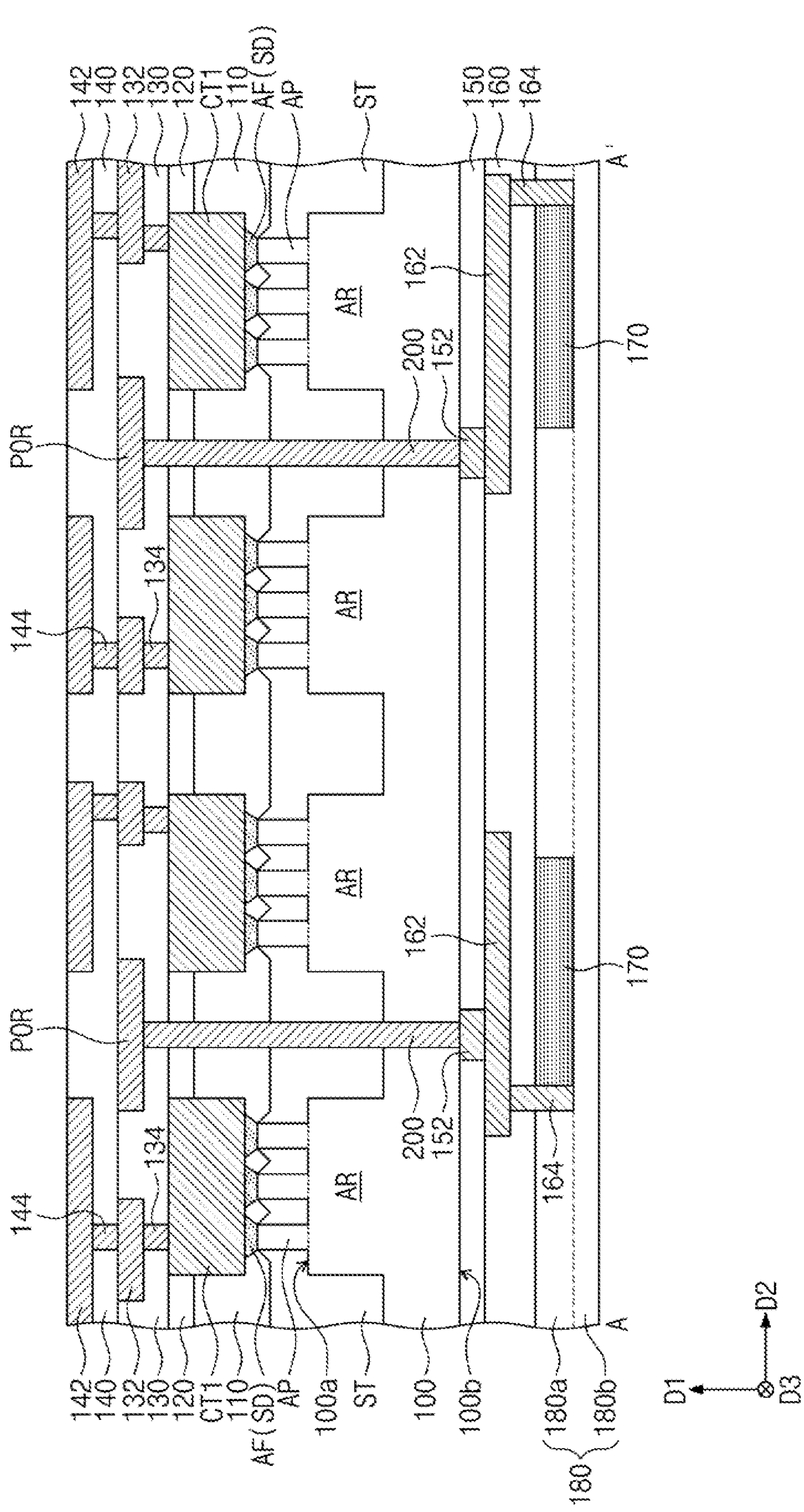
FIG. 7 is a sectional view, which is taken along the line A-A' of FIG. 1 to illustrate a method of fabricating a semiconductor device according to an embodiment.

FIG. 7 is a sectional view, which is taken along the line A-A' of FIG. 1 to illustrate a method of fabricating a semiconductor device according to an embodiment. For concise description, an element or step previously described with reference to FIGS. 1, 2A to 2D, 3A to 3D, and 4A to 4D may be identified by the same reference number without repeating an overlapping description thereof.

Referring to FIGS. 6 and 7, the lower insulating layer 150, the lower contacts 152, the first lower interconnection lines 162, and the first lower interlayer insulating layer 160 may be formed on the second surface 100*b* of the semiconductor substrate 100.

In an embodiment, at least one capacitor 170 may be formed on the first lower interlayer insulating layer 160. The capacitor 170 may include a plurality of first electrodes 172 and a plurality of second electrodes 176, which are alternately stacked in a direction (e.g., the first direction D1) perpendicular to the second surface 100*b* of the semiconductor substrate 100, and a dielectric layer 174, which is interposed between the first electrodes 172 and the second electrodes 176. In an embodiment, the formation of the capacitor 170 may include alternately depositing a plurality of first electrode layers, a plurality of second electrode layers, and a plurality of dielectric layers on the first lower interlayer insulating layer 160 and patterning the first electrode layers, the dielectric layers, and the second electrode layers to form the first electrodes 172, the second electrodes 176, and the dielectric layer 174 therebetween.

A first sub-insulating layer 180*a* may be formed on the first lower interlayer insulating layer 160 to cover the capacitor. A first electrode contact 164 may be formed at a side of the capacitor 170 to penetrate the first sub-insulating layer 180*a* and the first lower interlayer insulating layer 160. The first electrode contact 164 may be extended in a direction (e.g., the first direction D1) perpendicular to the second surface 100*b* of the semiconductor substrate 100 and may be connected to end portions of the first electrodes 172. The end portions of the first electrodes 172 may be in contact with a side surface of the first electrode contact 164. The first electrode contact 164 may be electrically connected to a corresponding one of the first lower interconnection lines 162.

A second sub-insulating layer 180*b* may be formed on the first sub-insulating layer 180*a* to cover the capacitor 170 and the first electrode contact 164. The first sub-insulating layer 180*a* and the second sub-insulating layer 180*b* may constitute a second lower interlayer insulating layer 180.

Referring back to FIGS. 5 and 6, a second electrode contact 166 may be formed at an opposite side of the capacitor 170 to penetrate the second lower interlayer insulating layer 180. The second electrode contact 166 may be extended in a direction (e.g., the first direction D1) perpendicular to the second surface 100*b* of the semiconductor substrate 100 and may be connected to end portions of the second electrodes 176. The end portions of the second electrodes 176 may be in contact with a side surface of the second electrode contact 166.

Second lower interconnection lines 182 may be formed on the second lower interlayer insulating layer 180. The second electrode contact 166 may be electrically connected to a corresponding one of the second lower interconnection lines 182.

Except for the afore-described differences, a method of fabricating a semiconductor device according to an embodiment may be substantially the same as the fabrication method described with reference to FIGS. 1, 2A to 2D, 3A to 3D, and 4A to 4D.

Figure 8:
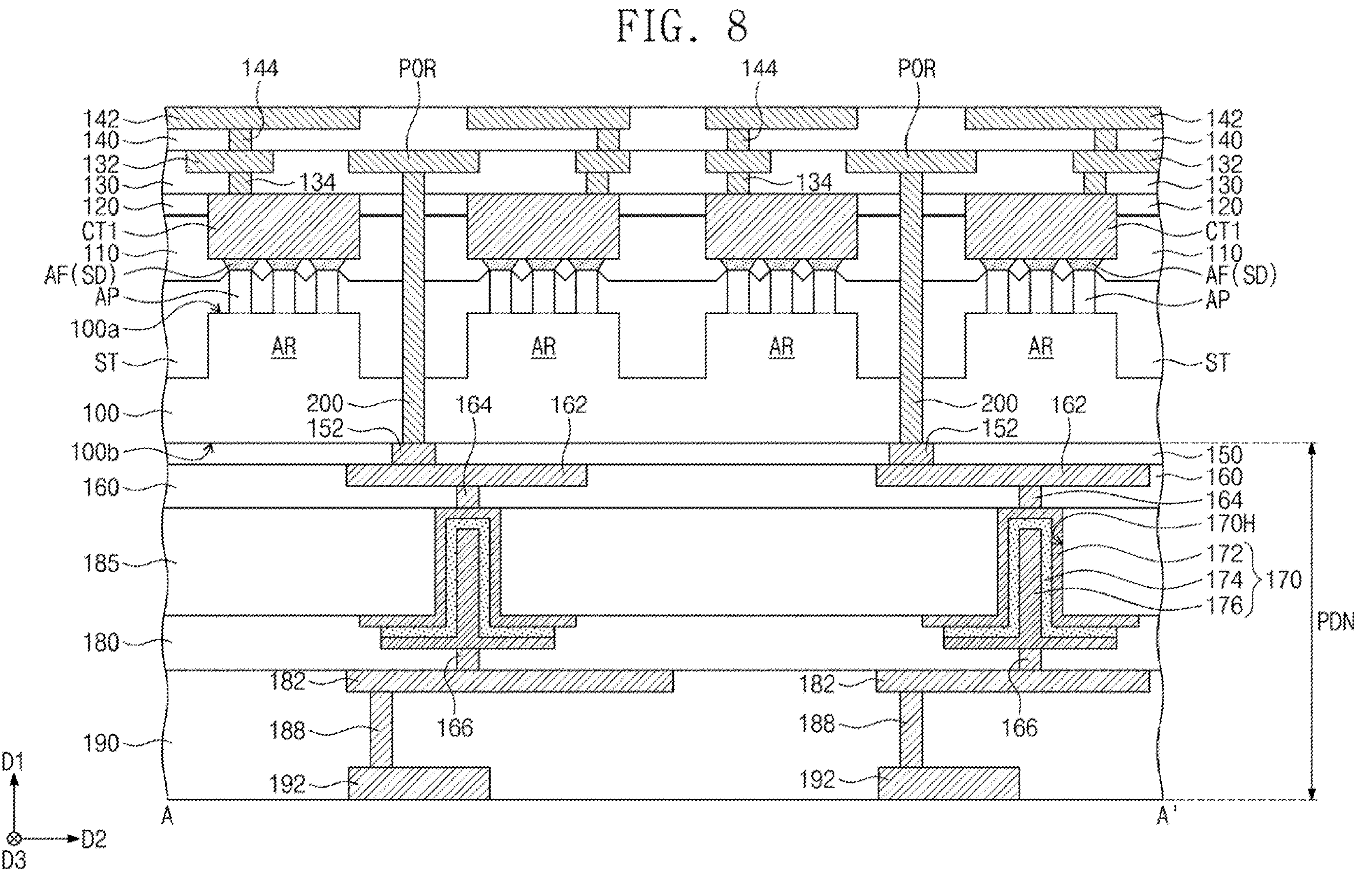
FIG. 8 is a sectional view, which is taken along the line A-A' of FIG. 1 to illustrate a semiconductor device according to an embodiment.

FIG. 8 is a sectional view, which is taken along the line A-A' of FIG. 1 to illustrate a semiconductor device according to an embodiment. For concise description, an element previously described with reference to FIGS. 1 and 2A to 2D may be identified by the same reference number without repeating an overlapping description thereof.

Referring to FIG. 8, in an embodiment, the at least one capacitor 170 may be disposed between the first lower interconnection lines 162 and the second lower interconnection lines 182. The capacitor 170 may be disposed between a corresponding one of the first lower interconnection lines 162 and a corresponding one of the second lower interconnection lines 182 and may be electrically connected to the corresponding first lower interconnection line 162 and the corresponding second lower interconnection line 182. The capacitor 170 may be disposed on the first lower interlayer insulating layer 160, and the second lower interlayer insulating layer 180 may cover the capacitor 170.

The power delivery network PDN may further include a mold layer 185 disposed between the first lower interconnection lines 162 and the second lower interconnection lines 182. The mold layer 185 may be interposed between the first lower interlayer insulating layer 160 and the second lower interlayer insulating layer 180. The mold layer 185 may be formed of or include at least one of silicon oxide, silicon nitride, silicon oxynitride, or low-k dielectric materials.

The capacitor 170 may be disposed in a vertical hole 170H, which is provided to penetrate the mold layer 185 and is extended in a direction (e.g., the first direction D1) perpendicular to the second surface 100*b* of the semiconductor substrate 100. The capacitor 170 may include a first electrode 172, which is disposed to conformally cover an inner surface of the vertical hole 170H, a second electrode 176, which is disposed in the vertical hole 170H and is spaced apart from the first electrode 172, and a dielectric layer 174, which is disposed in the vertical hole 170H and is interposed between the first and second electrodes 172 and 176. In an embodiment, the first electrode 172 may conformally cover an inner side surface of the vertical hole 170H and may be extended to cover a surface of the first lower interlayer insulating layer 160 exposed by the vertical hole 170H. The first electrode 172 may be extended in a direction (e.g., the second direction D2) parallel to the second surface 100*b* of the semiconductor substrate 100 to be interposed between the mold layer 185 and the second lower interlayer insulating layer 180. The second electrode 176 in the vertical hole 170H may be extended in a direction (e.g., the first direction D1) perpendicular to the second surface 100*b* of the semiconductor substrate 100, and the second electrode 176 between the mold layer 185 and the second lower interlayer insulating layer 180 may be extended to a region on the first electrode 172 in a direction (e.g., the second direction D2) parallel to the second surface 100*b* of the semiconductor substrate 100. The dielectric layer 174 in the vertical hole 170H may be interposed between the first electrode 172 and the second electrode 176, and the dielectric layer 174 between the mold layer 185 and the second lower interlayer insulating layer 180 may be extended to a region between the first electrode 172 and the second electrode 176 in a direction (e.g., the second direction D2) parallel to the second surface 100*b* of the semiconductor substrate 100.

The power delivery network PDN may further include a first electrode contact 164 between the first electrode 172 of the capacitor 170 and the corresponding first lower interconnection line 162, and may further include a second electrode contact 166 between the second electrode 176 of the capacitor and the corresponding second lower interconnection line 182. The first electrode contact 164 may be provided to penetrate the first lower interlayer insulating layer 160 and to electrically connect the first electrode 172 of the capacitor 170 to the corresponding first lower interconnection line 162. The second electrode contact 166 may be provided to penetrate the second lower interlayer insulating layer 180 and to electrically connect the second electrode 176 of the capacitor to the corresponding second lower interconnection line 182.

In at least one embodiment, the power delivery network PDN may include the capacitor 170 having an increased electrostatic capacitance.

Figure 9:
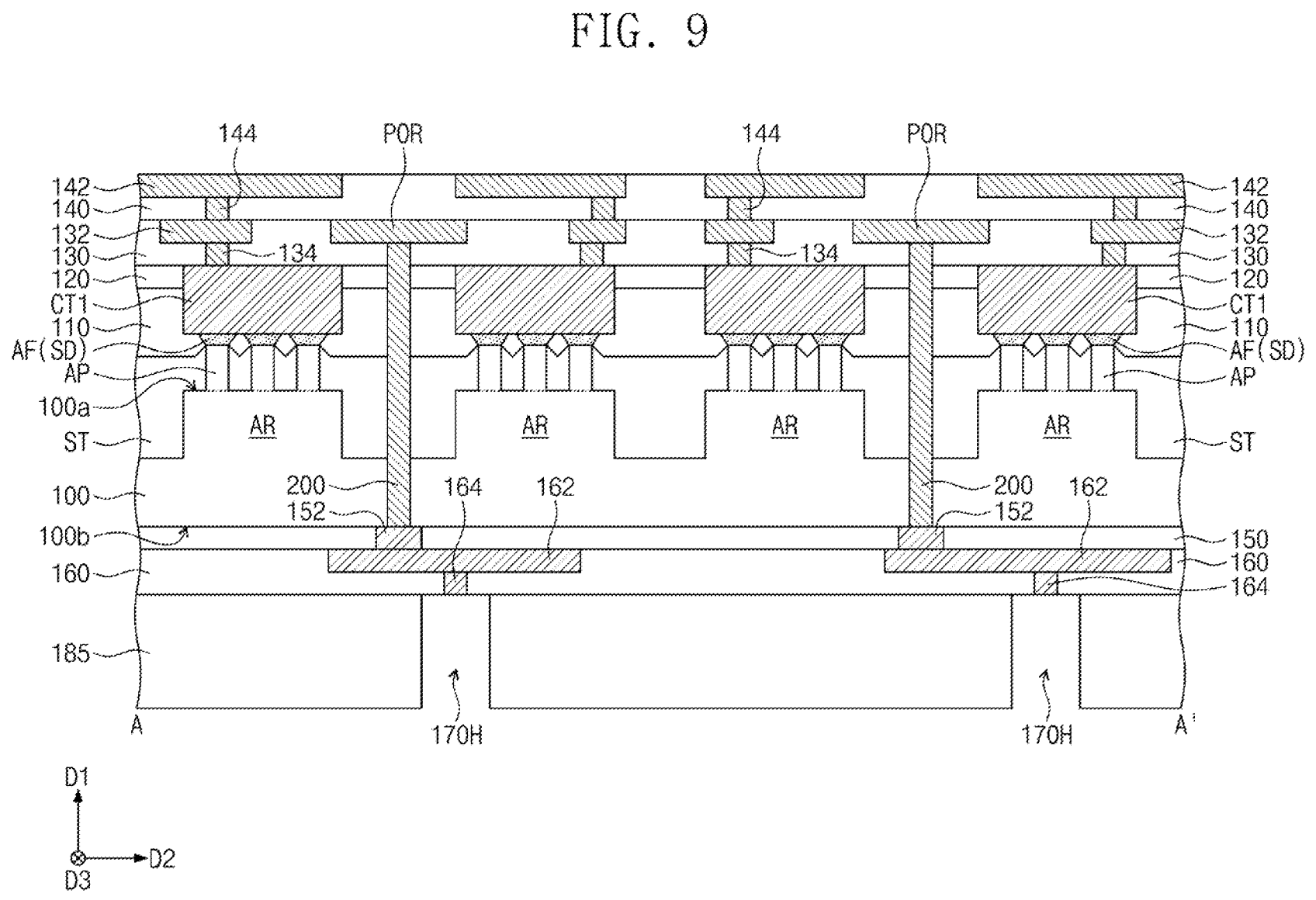
Figure 10:
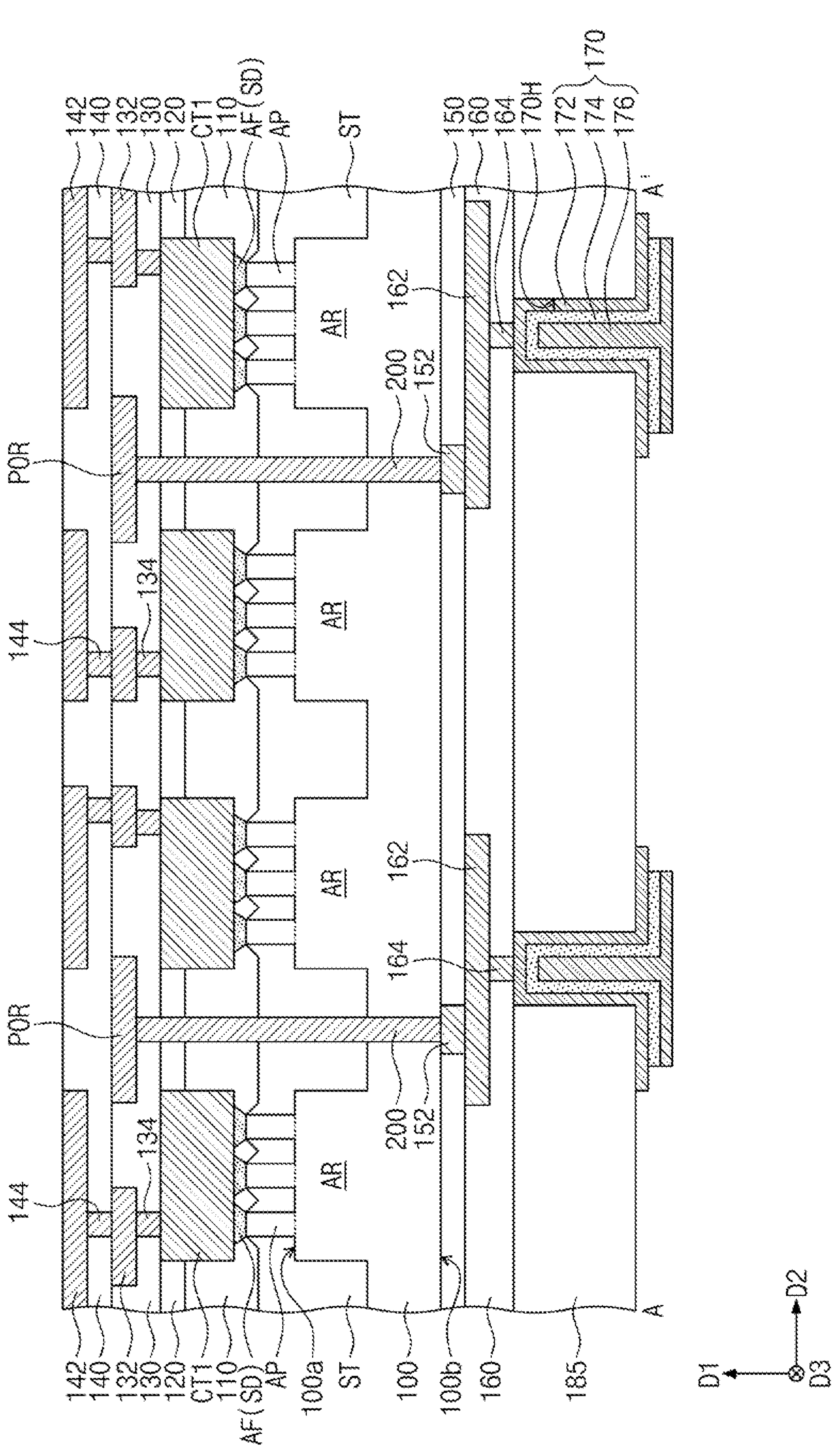

FIGS. 9 and 10 are sectional views, which are taken along the line A-A' of FIG. 1 to illustrate a method of fabricating a semiconductor device according to an embodiment. For concise description, an element or step previously described with reference to FIGS. 1, 2A to 2D, 3A to 3D, and 4A to 4D may be identified by the same reference number without repeating an overlapping description thereof.

Referring to FIG. 9, the lower insulating layer 150, the lower contacts 152, the first lower interconnection lines 162, and the first lower interlayer insulating layer 160 may be formed on the second surface 100*b* of the semiconductor substrate 100. The first electrode contact 164 may be formed in the first lower interlayer insulating layer 160 and may be electrically connected to a corresponding one of the first lower interconnection lines 162.

In an embodiment, a mold layer 185 may be formed on the first lower interlayer insulating layer 160, and a vertical hole 170H may be formed in the mold layer 185. The vertical hole 170H may be formed to penetrate the mold layer 185 in a direction (e.g., the first direction D1) perpendicular to the second surface 100*b* of the semiconductor substrate 100 and to expose the first electrode contact 164. In an embodiment, the formation of the vertical hole 170H may include a mask pattern on the mold layer 185 to define a position and shape of the vertical hole 170H and etching the mold layer 185 using the mask pattern as an etch mask.

Referring to FIG. 10, a capacitor 170 may be formed in the vertical hole 170H. The capacitor 170 may include a first electrode 172, which is disposed to conformally cover an inner surface of the vertical hole 170H, a second electrode 176, which is disposed in the vertical hole 170H and is spaced apart from the first electrode 172, and a dielectric layer 174, which is disposed in the vertical hole 170H and is interposed between the first and second electrodes 172 and 176. In an embodiment, the formation of the capacitor 170 may include forming a first electrode layer on the mold layer 185 to conformally cover an inner surface of the vertical hole 170H, forming a dielectric layer on the first electrode layer to fill a portion of the vertical hole 170H, forming a second electrode layer on the dielectric layer to fill a remaining portion of the vertical hole 170H, and removing or etching the first electrode layer, the dielectric layer, and the second electrode layer on the mold layer 185. The first electrode 172 of the capacitor 170 may be connected to or in contact with the first electrode contact 164 and may be electrically connected to the corresponding first lower interconnection line 162 through the first electrode contact 164.

Referring back to FIG. 8, a second lower interlayer insulating layer 180 may be formed on the mold layer 185 to cover the capacitor 170. Second lower interconnection lines 182 may be formed on the second lower interlayer insulating layer 180. A second electrode contact 166 may be formed in the second lower interlayer insulating layer 180 and may be connected to or in contact with the second electrode 176 of the capacitor 170. The second electrode contact 166 may be electrically connected to a corresponding one of the second lower interconnection lines 182. The second electrode 176 of the capacitor 170 may be electrically connected to the corresponding second lower interconnection line 182 through the second electrode contact 166.

Except for the afore-described differences, a method of fabricating a semiconductor device according to an embodiment may be substantially the same as the fabrication method described with reference to FIGS. 1, 2A to 2D, 3A to 3D, and 4A to 4D.

Figure 11:
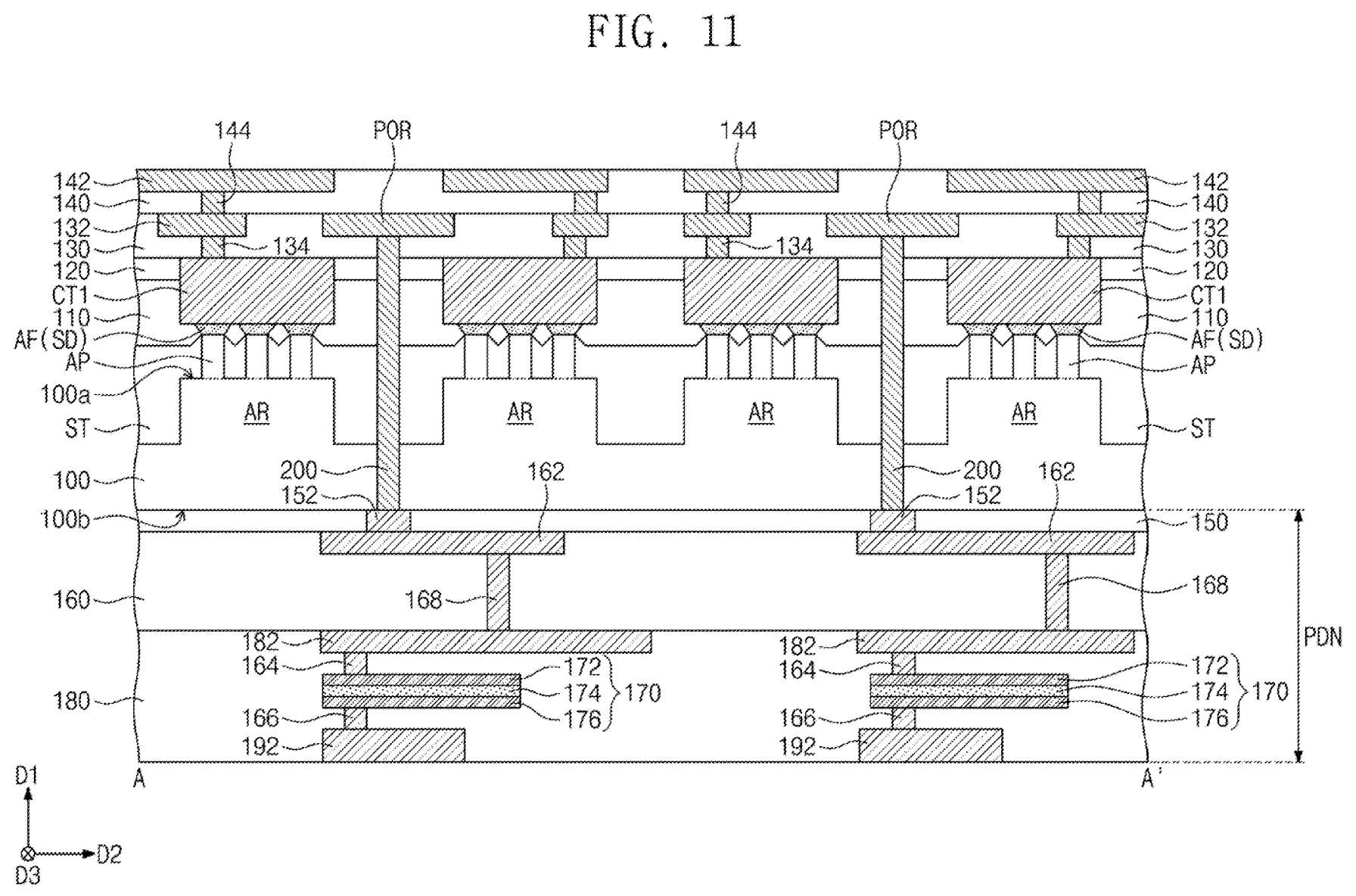

FIG. 11 is a sectional view, which is taken along the line A-A' of FIG. 1 to illustrate a semiconductor device according to an embodiment. For concise description, an element previously described with reference to FIGS. 1 and 2A to 2D may be identified by the same reference number without repeating an overlapping description thereof.

Referring to FIG. 11, the first lower interconnection lines 162 may be disposed on the lower insulating layer 150 and may be electrically connected to the lower contacts 152.

The second lower interconnection lines 182 may be spaced apart from the first lower interconnection lines 162 in a direction (e.g., the first direction D1) perpendicular to the second surface 100*b* of the semiconductor substrate 100, and the first lower vias 168 may be disposed between the first lower interconnection lines 162 and the second lower interconnection lines 182. The first lower vias 168 may connect the first lower interconnection lines 162 electrically to the second lower interconnection lines 182. The power delivery network PDN may include a first lower interlayer insulating layer 160, which is disposed on the lower insulating layer 150 to cover the first lower interconnection lines 162 and the first lower vias 168. The second lower interconnection lines 182 may be disposed on the first lower interlayer insulating layer 160. Each of the first lower vias 168 may be provided to penetrate the first lower interlayer insulating layer 160 and may be electrically connected to a corresponding one of the first lower interconnection lines 162 and a corresponding one of the second lower interconnection lines 182.

The power delivery network PDN may further include a second lower interlayer insulating layer 180, which is disposed on the first lower interlayer insulating layer 160 to cover the second lower interconnection lines 182. The third lower interconnection lines 192 may be disposed in the second lower interlayer insulating layer 180 and may be spaced apart from the second lower interconnection lines 182 in a direction (e.g., the first direction D1) perpendicular to the second surface 100*b* of the semiconductor substrate 100.

In an embodiment, the at least one capacitor 170 may be disposed between the second and third lower interconnection lines 182 and 192 and in the second lower interlayer insulating layer 180. The capacitor 170 may be disposed between a corresponding one of the second lower interconnection lines 182 and a corresponding one of the third lower interconnection lines 192 and may be electrically connected to the corresponding second lower interconnection line 182 and the corresponding third lower interconnection line 192.

The capacitor 170 may include the first electrode 172, the dielectric layer 174, and the second electrode 176, which are provided between the corresponding second lower interconnection line 182 and the corresponding third lower interconnection line 192 and are sequentially stacked in a direction (e.g., the first direction D1) perpendicular to the second surface 100*b* of the semiconductor substrate 100. The first electrode 172, the dielectric layer 174, and the second electrode 176 may be extended in a direction (e.g., the second direction D2) parallel to the second surface 100*b* of the semiconductor substrate 100. The corresponding second lower interconnection line 182, the capacitor 170, and the corresponding third lower interconnection line 192 may be extended in a direction (e.g., the second direction D2) parallel to the second surface 100*b* of the semiconductor substrate 100.

The power delivery network PDN may further include a first electrode contact 164 between the first electrode 172 of the capacitor 170 and the corresponding second lower interconnection line 182 and a second electrode contact 166 between the second electrode 176 of the capacitor and the corresponding third lower interconnection line 192. The first electrode contact 164 may electrically connect the first electrode 172 of the capacitor 170 to the corresponding second lower interconnection line 182, and the second electrode contact 166 may electrically connect the second electrode 176 of the capacitor to the corresponding third lower interconnection line 192.

Except for the disposition of the capacitor 170, the first electrode contact 164, and the second electrode contact 166, the semiconductor device according to at least one embodiment may have substantially the same features as the semiconductor device of FIGS. 1 and 2A to 2D. In an embodiment, the capacitor 170, the first electrode contact 164, and the second electrode contact 166 may be configured to have substantially the same features as the capacitor 170, the first electrode contact 164, and the second electrode contact 166 described with reference to FIGS. 5 and 6 or to have substantially the same features as the capacitor 170, the first electrode contact 164, and the second electrode contact 166 described with reference to FIG. 8.

Figure 12:
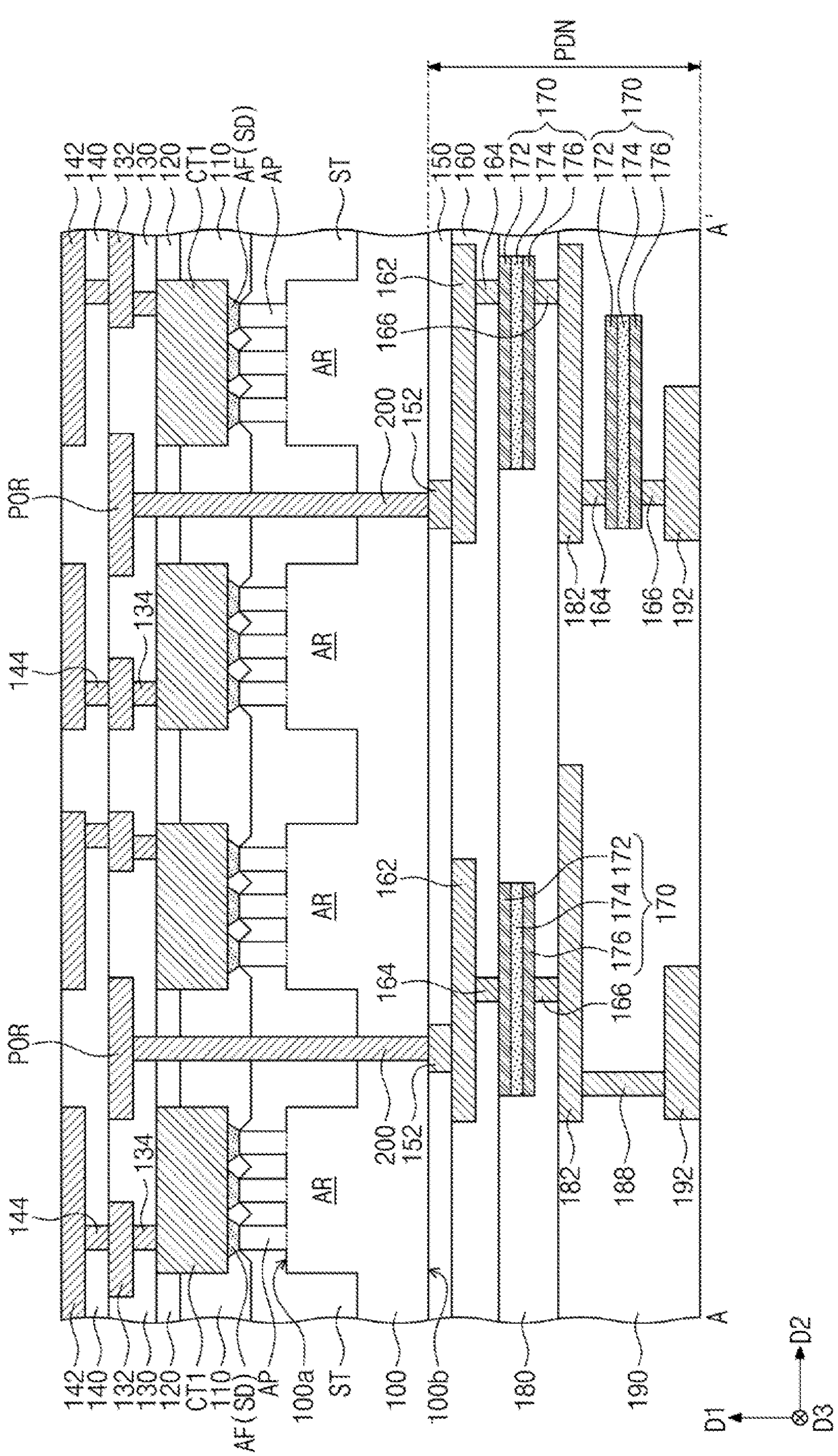
FIG. 12 is a sectional view, which is taken along the line A-A' of FIG. 1 to illustrate a semiconductor device according to an embodiment.

FIG. 12 is a sectional view, which is taken along the line A-A' of FIG. 1 to illustrate a semiconductor device according to an embodiment. For concise description, an element previously described with reference to FIGS. 1 and 2A to 2D may be identified by the same reference number without repeating an overlapping description thereof.

Referring to FIG. 12, the power delivery network PDN may include the capacitor 170 disposed between the first lower interconnection lines 162 and the second lower interconnection lines 182 and may further include an additional capacitor 170 disposed between the second and third lower interconnection lines 182 and 192.

In an embodiment, the capacitor 170 may be disposed between a corresponding one of the first lower interconnection lines 162 and a corresponding one of the second lower interconnection lines 182 and may be electrically connected to the corresponding first lower interconnection line 162 and the corresponding second lower interconnection line 182. The first electrode contact 164 may be provided to penetrate the first lower interlayer insulating layer 160 and to electrically connect the first electrode 172 of the capacitor 170 to the corresponding first lower interconnection line 162. The second electrode contact 166 may be provided to penetrate the second lower interlayer insulating layer 180 and to electrically connect the second electrode 176 of the capacitor 170 to the corresponding second lower interconnection line 182.

The additional capacitor 170 may be disposed between a corresponding one of the second lower interconnection lines 182 and a corresponding one of the third lower interconnection lines 192 and may be electrically connected to the corresponding second lower interconnection line 182 and the corresponding third lower interconnection line 192. The additional capacitor 170 may be disposed in the third lower interlayer insulating layer 190 and may be configured to have substantially the same features as the capacitor 170. In other words, the additional capacitor 170 may include the first electrode 172, the dielectric layer 174, and the second electrode 176, which are provided between the corresponding second lower interconnection line 182 and the corresponding third lower interconnection line 192 and are sequentially stacked in a direction (e.g., the first direction D1) perpendicular to the second surface 100*b* of the semiconductor substrate 100. The additional capacitor 170 may be of the same type as the capacitor 170.

The power delivery network PDN may further include an additional first electrode contact 164, which is provided between the first electrode 172 of the additional capacitor 170 and the corresponding second lower interconnection line 182, and an additional second electrode contact 166, which is provided between the second electrode 176 of the additional capacitor 170 and the corresponding third lower interconnection line 192. The additional first electrode contact 164 may electrically connect the first electrode 172 of the additional capacitor 170 to the corresponding second lower interconnection line 182, and the additional second electrode contact 166 may electrically connect the second electrode 176 of the additional capacitor 170 to the corresponding third lower interconnection line 192. The additional first electrode contact 164 and the additional second electrode contact 166 may be formed of or include at least one of conductive materials (e.g., metallic materials and/or conductive metal nitride materials).

In an embodiment, the capacitor 170, the first electrode contact 164, and the second electrode contact 166 may be configured to have substantially the same features as the capacitor 170, the first electrode contact 164, and the second electrode contact 166 described with reference to FIGS. 5 and 6 or to have substantially the same features as the capacitor 170, the first electrode contact 164, and the second electrode contact 166 described with reference to FIG. 8. In addition, the additional capacitor 170, the additional first electrode contact 164, and the additional second electrode contact 166 may be configured to have substantially the same features as the capacitor 170, the first electrode contact 164, and the second electrode contact 166 described with reference to FIGS. 5 and 6 or to have substantially the same features as the capacitor 170, the first electrode contact 164, and the second electrode contact 166 described with reference to FIG. 8.

Figure 13:
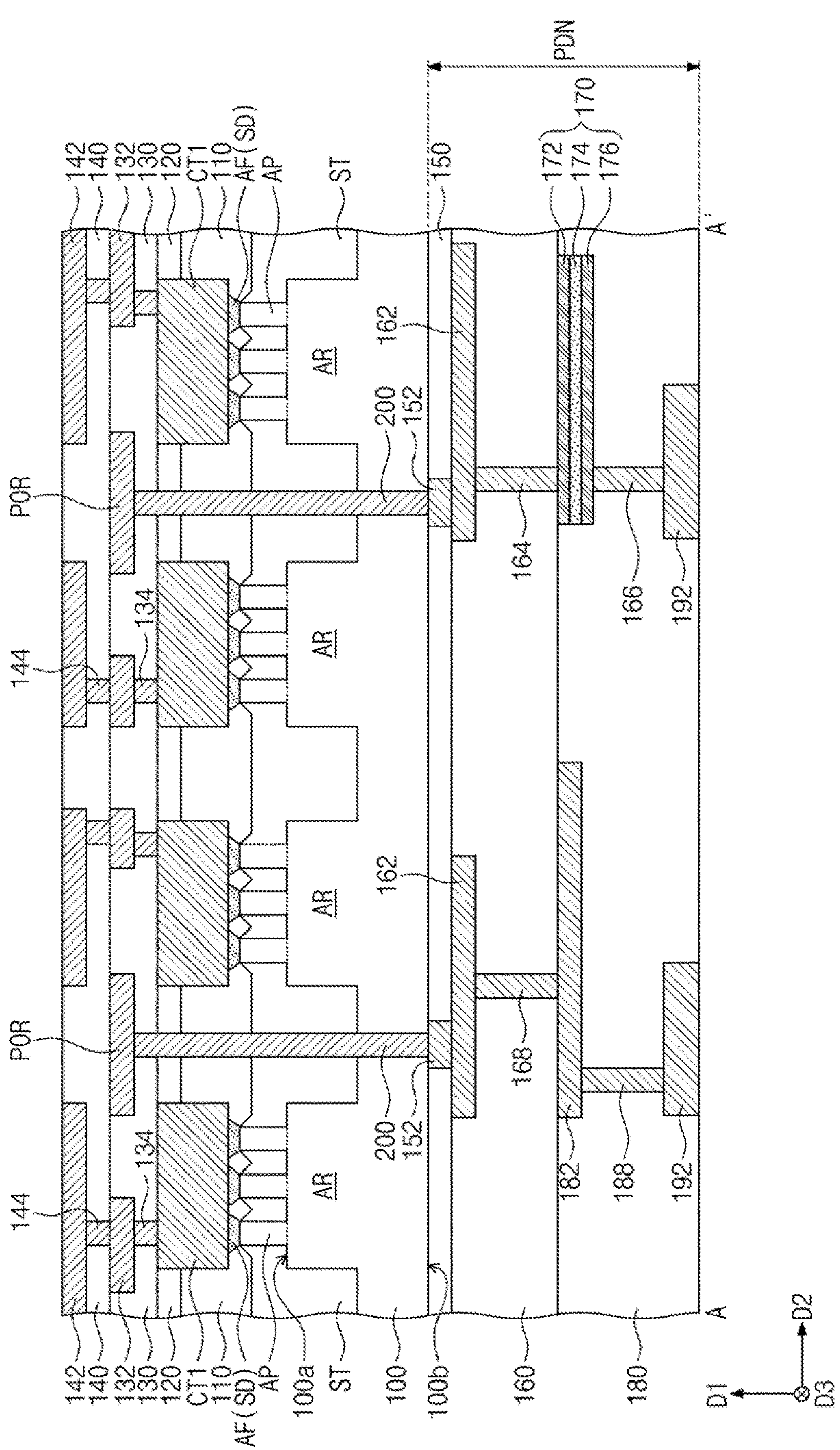
FIG. 13 is a sectional view, which is taken along the line A-A' of FIG. 1 to illustrate a semiconductor device according to an embodiment.

FIG. 13 is a sectional view, which is taken along the line A-A' of FIG. 1 to illustrate a semiconductor device according to an embodiment. For concise description, an element previously described with reference to FIGS. 1 and 2A to 2D may be identified by the same reference number without repeating an overlapping description thereof.

Referring to FIG. 13, the first lower interconnection lines 162 may be disposed on the lower insulating layer 150 and may be electrically connected to the lower contacts 152.

The second lower interconnection lines 182 may be spaced apart from the first lower interconnection lines 162 in a direction (e.g., the first direction D1) perpendicular to the second surface 100*b* of the semiconductor substrate 100, and the first lower vias 168 may be disposed between the first lower interconnection lines 162 and the second lower interconnection lines 182. The first lower vias 168 may electrically connect the first lower interconnection lines 162 to the second lower interconnection lines 182. The power delivery network PDN may include a first lower interlayer insulating layer 160, which is disposed on the lower insulating layer 150 to cover the first lower interconnection lines 162 and the first lower vias 168. The second lower interconnection lines 182 may be disposed on the first lower interlayer insulating layer 160. Each of the first lower vias 168 may be provided to penetrate the first lower interlayer insulating layer 160 and may be electrically connected to a corresponding one of the first lower interconnection lines 162 and a corresponding one of the second lower interconnection lines 182.

The power delivery network PDN may further include a second lower interlayer insulating layer 180, which is disposed on the first lower interlayer insulating layer 160 to cover the second lower interconnection lines 182. The third lower interconnection lines 192 may be disposed in the second lower interlayer insulating layer 180 and may be spaced apart from the second lower interconnection lines 182 in a direction (e.g., the first direction D1) perpendicular to the second surface 100*b* of the semiconductor substrate 100. The second lower vias 188 may be disposed in the second lower interlayer insulating layer 180 and between the second and third lower interconnection lines 182 and 192. The second lower vias 188 electrically may connect the second lower interconnection lines 182 to the third lower interconnection lines 192.

In an embodiment, the power delivery network PDN may include at least one capacitor 170 disposed between the first lower interconnection lines 162 and the third lower interconnection lines 192. The capacitor 170 may be disposed on the first lower interlayer insulating layer 160. The second lower interlayer insulating layer 180 may cover the capacitor 170. The capacitor 170 may be disposed between a corresponding one of the first lower interconnection lines 162 and a corresponding one of the third lower interconnection lines 192 and may be electrically connected to the corresponding first lower interconnection line 162 and the corresponding third lower interconnection line 192.

The capacitor 170 may include the first electrode 172, the dielectric layer 174, and the second electrode 176, which are provided between the corresponding first lower interconnection line 162 and the corresponding third lower interconnection line 192 and are sequentially stacked in a direction (e.g., the first direction D1) perpendicular to the second surface 100*b* of the semiconductor substrate 100. The first electrode 172, the dielectric layer 174, and the second electrode 176 may be extended in a direction (e.g., the second direction D2) parallel to the second surface 100*b* of the semiconductor substrate 100. The corresponding first lower interconnection line 162, the capacitor 170, and the corresponding third lower interconnection line 192 may be extended in a direction (e.g., the second direction D2) parallel to the second surface 100*b* of the semiconductor substrate 100.

The power delivery network PDN may further include a first electrode contact 164 between the first electrode 172 of the capacitor 170 and the corresponding first lower interconnection line 162, and a second electrode contact 166 between the second electrode 176 of the capacitor 170 and the corresponding third lower interconnection line 192. The first electrode contact 164 may be provided to penetrate the first lower interlayer insulating layer 160 and to electrically connect the first electrode 172 of the capacitor 170 to the corresponding first lower interconnection line 162. The second electrode contact 166 may be provided to penetrate the second lower interlayer insulating layer 180 and to electrically connect the second electrode 176 of the capacitor 170 to the corresponding third lower interconnection line 192.

Except for the disposition of the capacitor 170, the first electrode contact 164, and the second electrode contact 166, the semiconductor device according to the present embodiments may have substantially the same features as the semiconductor device of FIGS. 1 and 2A to 2D. In an embodiment, the capacitor 170, the first electrode contact 164, and the second electrode contact 166 may be configured to have substantially the same features as the capacitor 170, the first electrode contact 164, and the second electrode contact 166 described with reference to FIGS. 5 and 6 or to have substantially the same features as the capacitor 170, the first electrode contact 164, and the second electrode contact 166 described with reference to FIG. 8.

Figure 14:
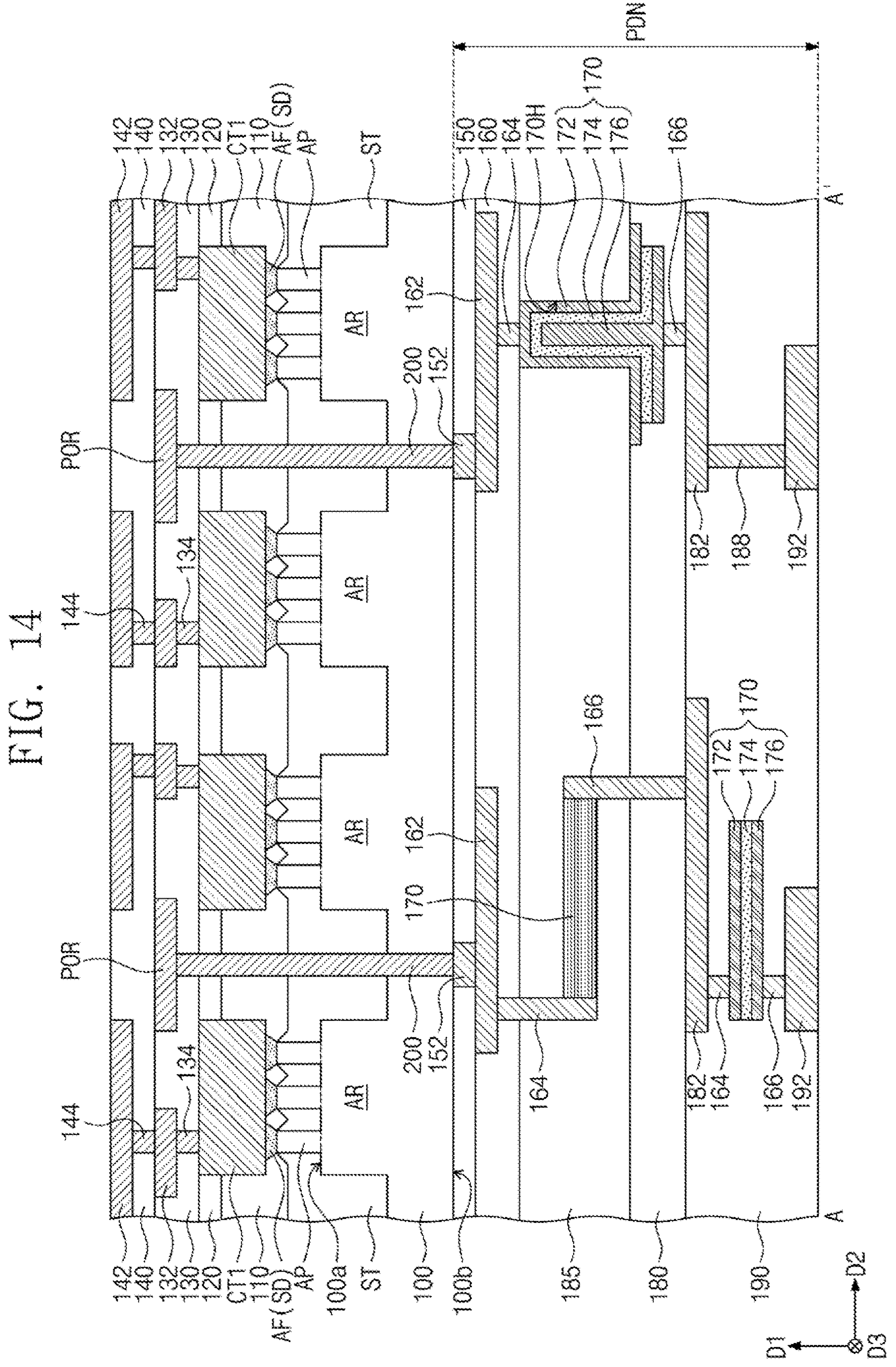
FIG. 14 is a sectional view, which is taken along the line A-A' of FIG. 1 to illustrate a semiconductor device according to an embodiment.

FIG. 14 is a sectional view, which is taken along the line A-A' of FIG. 1 to illustrate a semiconductor device according to an embodiment. For concise description, an element previously described with reference to FIGS. 1 and 2A to 2D may be identified by the same reference number without repeating an overlapping description thereof.

Referring to FIG. 14, the power delivery network PDN may include a plurality of capacitors 170, which are disposed between the first lower interconnection lines 162 and the second lower interconnection lines 182 and between the second and third lower interconnection lines 182 and 192. At least one of the capacitors 170 may be disposed between the first lower interconnection lines 162 and the third lower interconnection lines 192, as described with reference to FIG. 13.

In an embodiment, the capacitors 170 may be capacitors that are of different types. In other words, for example, the capacitors 170 may have at least one of different shapes and different numbers of electrodes. As an example, one of the capacitors 170 may be configured to have substantially the same features as the capacitor 170 described with reference to FIGS. 2A, 11, 12, and 13, another of the capacitors 170 may be configured to have substantially the same features as the capacitor 170 described with reference to FIGS. 5 and 6, and other of the capacitors 170 may be configured to have substantially the same features as the capacitor 170 described with reference to FIG. 8.

According to an embodiment, a power delivery network may be disposed on a second surface of a semiconductor substrate and may be electrically connected to a power rail, which is disposed on a first surface of the semiconductor substrate, through a penetration via. Accordingly, it may be possible to easily increase an integration density of the semiconductor device. In addition, the power delivery network may include at least one capacitor disposed between lower interconnection lines, which are vertically spaced apart from each other. The capacitor may be used as a de-coupling capacitor, and in this case, a power integrity property of the power delivery network may be improved. Thus, it may be possible to provide a semiconductor device with an increased integration density and improved electric characteristics.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device comprising:

a semiconductor substrate having a first surface and a second surface opposite to the first surface, the semiconductor substrate comprising one of a silicon substrate, a germanium substrate, or a silicon-germanium substrate;

a transistor provided on the first surface of the semiconductor substrate;

a power rail provided on the first surface of the semiconductor substrate and electrically connected to the transistor;

a first lower interconnection line and a second lower interconnection line that are provided on the second surface of the semiconductor substrate and spaced apart from each other in a first direction perpendicular to the second surface of the semiconductor substrate;

a penetration via penetrating the semiconductor substrate and connecting a corresponding one of the first and second lower interconnection lines to the power rail; and a capacitor provided between and electrically connected to the first and second lower interconnection lines.

2. The semiconductor device of claim 1, wherein the capacitor comprises a first electrode, a second electrode, and a dielectric layer between the first electrode and the second electrode, wherein the first electrode is electrically connected to the first lower interconnection line, and wherein the second electrode is electrically connected to the second lower interconnection line.

3. The semiconductor device of claim 2, wherein the first and second lower interconnection lines extend in a second direction parallel to the second surface of the semiconductor substrate, and wherein the semiconductor device further comprises:

a first electrode contact electrically connecting the first lower interconnection line to the first electrode; and a second electrode contact electrically connecting the second lower interconnection line to the second electrode.

4. The semiconductor device of claim 3, wherein each of the first electrode contact and the second electrode contact extends in the first direction.

5. The semiconductor device of claim 4, wherein each of the first electrode, the second electrode, and the dielectric layer extend in the second direction, between the first electrode contact and the second electrode contact.

6. The semiconductor device of claim 1, wherein the capacitor comprises:

a plurality of first electrodes and a plurality of second electrodes alternately stacked in the first direction; and a dielectric layer interposed between adjacent first electrodes of the plurality of first electrodes and the plurality of second electrodes, wherein the plurality of first electrodes are electrically connected to of the first lower interconnection line, and wherein the plurality of second electrodes are electrically connected to the second lower interconnection line.

7. The semiconductor device of claim 6, wherein each of the first and second lower interconnection lines extend in a second direction parallel to the second surface of the semiconductor substrate, wherein the semiconductor device further comprises:

a first electrode contact provided at a first side of the capacitor, the first electrode contact being electrically connected to an end portion of each of the plurality of first electrodes and connected to the first lower interconnection line; and a second electrode contact provided at a second side of the capacitor opposite to the first side, the second electrode contact being electrically connected to an end portion of each of the plurality of second electrodes and connected to the second lower interconnection line.

8. The semiconductor device of claim 7, wherein each of the first electrode contact and the second electrode contact extends in the first direction.

9. The semiconductor device of claim 1, further comprising a mold layer provided between the first and second lower interconnection lines, wherein the capacitor is provided in a vertical hole penetrating the mold layer in the first direction, wherein the capacitor comprises:

a first electrode provided on an inner surface of the vertical hole;

a second electrode provided in the vertical hole and spaced apart from the first electrode; and a dielectric layer provided in the vertical hole and interposed between the first electrode and the second electrode, wherein the first electrode is electrically connected to the first lower interconnection line, and wherein the second electrode is electrically connected to the second lower interconnection line.

10. The semiconductor device of claim 9, wherein each of the first and second lower interconnection lines extend in a second direction parallel to the second surface of the semiconductor substrate, and wherein the semiconductor device further comprises:

a first electrode contact electrically connecting the first lower interconnection line to the first electrode; and a second electrode contact electrically connecting the second lower interconnection line to the second electrode.

11. A semiconductor device comprising:

a semiconductor substrate having a first surface and a second surface opposite to the first surface;

active patterns protruding from the first surface of the semiconductor substrate in a first direction perpendicular to the second surface of the semiconductor substrate and spaced apart from each other in a second direction parallel to the second surface of the semiconductor substrate;

a device isolation layer on the first surface of the semiconductor substrate and between the active patterns;

gate electrodes provided on the first surface of the semiconductor substrate and crossing the active patterns and the device isolation layer;

a power rail provided on the first surface of the semiconductor substrate and electrically connected to a source/drain region of a corresponding active pattern of the active patterns;

lower interconnection lines provided on the second surface of the semiconductor substrate;

a penetration via penetrating the semiconductor substrate and connecting a corresponding one of the lower interconnection lines to the power rail; and a capacitor electrically connected to a pair of the lower interconnection lines, wherein, in the first direction, the capacitor is between the respective lower interconnection lines of the pair of the lower interconnection lines, and wherein the lower interconnection lines are spaced apart from each other in the first direction and extend in the second direction.

12. The semiconductor device of claim 11, wherein the pair of the lower interconnection lines are closer to each other in the first direction than to any other lower interconnection line of the lower interconnection lines.

13. The semiconductor device of claim 11, wherein the pair of the lower interconnection lines comprises a first lower interconnection line and a second lower interconnection line, wherein the lower interconnection lines further comprise a third lower interconnection line, wherein, the first lower interconnection line, the second lower interconnection line, and the third lower interconnection line are sequentially stacked on the second surface of the semiconductor substrate and are spaced apart from each other in the first direction, and wherein the capacitor is between and electrically connected to the first lower interconnection line and the third lower interconnection line.

14. The semiconductor device of claim 11, further comprising an additional capacitor provided between and electrically connected to another pair of the lower interconnection lines.

15. The semiconductor device of claim 14, wherein the capacitor and the additional capacitor are of a same type.

16. The semiconductor device of claim 14, wherein the capacitor and the additional capacitor are of different types.

17. The semiconductor device of claim 11, wherein the capacitor comprises a first electrode, a second electrode, and a dielectric layer between the first electrode and the second electrode, wherein the first electrode is electrically connected to one of the pair of the lower interconnection lines, and wherein the second electrode is electrically connected to the other one of the pair of the lower interconnection lines.

18. The semiconductor device of claim 17, wherein each of the first electrode, the second electrode, and the dielectric layer extends in the second direction, between the pair of the lower interconnection lines.

19. The semiconductor device of claim 17, further comprising a mold layer between the pair of the lower interconnection lines, wherein the capacitor is in a vertical hole penetrating the mold layer in the first direction, wherein the first electrode is in an inner surface of the vertical hole, wherein the second electrode is in the vertical hole and spaced apart from the first electrode, and wherein the dielectric layer is in the vertical hole and interposed between the first electrode and the second electrode.

20. The semiconductor device of claim 11, wherein the capacitor comprises:

first electrodes, dielectric layers, and second electrodes, which are alternately stacked in the first direction, wherein the first electrodes are electrically connected to one of the pair of the lower interconnection lines, and wherein the second electrodes are electrically connected to the other one of the pair of the lower interconnection lines.

* * * * *